(12) United States Patent
Lee

(10) Patent No.: US 9,468,069 B2
(45) Date of Patent: Oct. 11, 2016

(54) SMOOTH BRIGHTNESS ADJUSTMENT FOR COLOR-TUNABLE LIGHT SOURCE MODULE

(71) Applicant: LedEngin, Inc., San Jose, CA (US)

(72) Inventor: Kachun Lee, Fremont, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 14/813,026

(22) Filed: Jul. 29, 2015

(65) Prior Publication Data

US 2016/0044753 A1    Feb. 11, 2016

Related U.S. Application Data

(60) Provisional application No. 62/035,341, filed on Aug. 8, 2014.

(51) Int. Cl.
*H05B 33/08*    (2006.01)
*H03K 7/08*    (2006.01)

(52) U.S. Cl.
CPC ............. *H05B 33/086* (2013.01); *H03K 7/08* (2013.01); *H05B 33/0824* (2013.01)

(58) Field of Classification Search
None
See application file for complete search history.

(56) References Cited

U.S. PATENT DOCUMENTS

| | | | | |
|---|---|---|---|---|
| 6,016,038 | A * | 1/2000 | Mueller | H05B 33/0857 315/291 |
| 8,598,809 | B2 | 12/2013 | Negley | |
| 2004/0155608 | A1 | 8/2004 | Trinschek et al. | |
| 2006/0176693 | A1 | 8/2006 | Walter et al. | |
| 2008/0048582 | A1 | 2/2008 | Robinson | |
| 2008/0054825 | A1 | 3/2008 | Gulsen et al. | |
| 2009/0189530 | A1 * | 7/2009 | Ashdown | H05B 33/0869 315/152 |
| 2012/0043910 | A1 | 2/2012 | Nagashima et al. | |
| 2013/0049634 | A1 | 2/2013 | Neudorf | |
| 2013/0063042 | A1 | 3/2013 | Bora | |
| 2014/0062321 | A1 | 3/2014 | McMahon | |
| 2014/0239841 | A1 | 8/2014 | Gilman | |
| 2015/0029713 | A1 | 1/2015 | Fieberg et al. | |

FOREIGN PATENT DOCUMENTS

| | | |
|---|---|---|
| EP | 1234140 B1 | 8/2002 |
| EP | 1610593 B1 | 12/2005 |

OTHER PUBLICATIONS

Office Action mailed Jan. 13, 2016 in U.S. Appl. No. 14/244,789, 20 pages.
Office Action mailed Jun. 5, 2015 in U.S. Appl. No. 14/244,787, 20 pages.
Office Action mailed Mar. 16, 2015 in U.S. Appl. No. 14/244,789, 18 pages.
Office Action mailed Apr. 8, 2016 in U.S. Appl. No. 14/244,787, 19 pages.

* cited by examiner

*Primary Examiner* — Dedei K Hammond
(74) *Attorney, Agent, or Firm* — Kilpatrick Townsend & Stockton, LLP

(57) ABSTRACT

A first sequence of pulses having a high frequency can be modulated using a second sequence of pulses having a lower frequency. The pulse width of the second sequence of pulses can be perturbed from a nominal pulse width on a per-pulse basis, within a perturbation range corresponding to the pulse period of the first sequence of pulses. In one application, the resulting output can be used to drive LEDs. In some instances, two or more channels of LEDs of different colors can be supported, with the pulse width of the first pulse sequence being selected per-channel based on a desired light color and the nominal pulse width of the second pulse sequence being selected for all channels based on a desired brightness.

24 Claims, 19 Drawing Sheets

SMOOTH BRIGHTNESS ADJUSTMENT FOR COLOR-TUNABLE LIGHT SOURCE MODULE

CROSS-REFERENCE TO RELATED APPLICATIONS

This application claims the benefit of U.S. Provisional Application No. 62/035,341, filed Aug. 8, 2014, the disclosure of which is incorporated by reference herein in its entirety.

This disclosure is related to U.S. application Ser. No. 14/244,787, filed Apr. 3, 2014, entitled "Color Tunable Light Source Module with Brightness Control," the disclosure of which is incorporated by reference herein in its entirety.

BACKGROUND

The present disclosure relates generally to light-emitting devices and in particular to a color-tunable light source module with brightness control.

Light sources based on light-emitting diodes (LEDs) are emerging as an energy-efficient replacement for conventional incandescent or halogen light sources in a variety of applications. Compared to conventional light sources, LED-based light sources can provide significantly higher energy efficiency and longer life.

However, a number of challenges must be addressed to provide practical LED-based light sources. For example, a given LED emits light in a narrow band of wavelengths, which creates challenges for the production of white light (which is generally a mixture of different wavelengths). Further, not all white light is created equal. The human eye is sensitive to the differences among white-light sources such as fluorescent light, incandescent light, and sunlight. These differences can be quantified in terms of well-known metrics such as color temperature (CCT) and/or color rendering index (CRI).

In addition, to provide sufficient light for many applications, high brightness and therefore high operating current is required. High current can lead to a buildup of heat, which can damage the LEDs. Accordingly, effective heat transfer and/or other techniques are significant in the design of high-performance LED-based light sources.

SUMMARY

Certain embodiments of the present invention relate to LED-based light source modules that incorporate color tunability and brightness control. In some embodiments, a user can independently select a desired color temperature and brightness and can change either or both dynamically. To allow dynamic changes in color temperature, the LED-based light source can include a single emitter substrate on which multiple LED dice (also referred to as LEDs) are disposed. The LEDs can be electrically connected into some number of independently addressable groups, with each group producing light of a different color or color temperature. For example, the LEDs can include three groups: one group that emits yellowish light (e.g., blue LEDs with a first quantity of yellow phosphor disposed on a light-emitting surface), one group that emits whitish light (e.g., blue LEDs with a second, smaller, quantity of yellow phosphor disposed on a light-emitting surface), and one group that emits red light (e.g., red LEDs). The groups of LEDs are independently addressable, meaning that the operating current supplied to each group can be independently controlled. By controlling the relative operating current provided to each group, a desired color temperature can be achieved, and by controlling the absolute operating currents, the brightness of the output light can be controlled.

In some embodiments, current control can be provided by generating a separate train of digital pulses for each independently-addressable group of LEDs; each train can include a channel-specific number of pulses having a channel-specific pulse width. The pulse widths can be selected to determine the relative brightness of each group of LEDs (and therefore the color temperature) and the number of pulses in the train can be selected to be the same for all groups, with the number controlling the overall brightness.

In some embodiments, the pulse generation can be implemented using cascading pulse width modulators ("PWMs") and a Buck converter or similar circuits to deliver current to each group of LEDs. A first PWM, also referred to as a "regulator PWM," can generate pulses having a width selected based on the desired relative brightness of each group, and the Buck converter can be used to provide output current. A second PWM, also referred to as a "dimming PWM," can be used to pass through or suppress the output current based on a nominal pulse width that depends on the desired overall brightness. The pulse width of the second PWM can be deliberately perturbed from its nominal value using a perturbation amount that is variable from pulse to pulse, with the variation being in a range corresponding to the pulse period of the first PWM. This can provide a smoother and more uniform brightness adjustment across a range of intensities. In some embodiments, the perturbation can also reduce or eliminate stray electromagnetic emissions. The perturbation can be accomplished, e.g., using a cyclical counter or a random number generator to determine the perturbation amount for each pulse. In some embodiments, a pulse pattern can be generated that models an output of cascading PWMs, e.g., by using control software to control one pulse generator.

Such perturbation techniques can be applied in a variety of situations in which an output of a first PWM is modulated by a second PWM (also referred to as cascading PWMs), including but not limited to controlling a light source. A first sequence of pulses having a high frequency can be modulated using a second sequence of pulses having a lower frequency. The pulse width of the second sequence of pulses can be perturbed from a nominal pulse width on a per-pulse basis, within a perturbation range corresponding to the pulse period of the first sequence of pulses. In one application, the resulting output can be used to drive LEDs in a light source. In some instances, two or more channels of LEDs of different colors can be supported, with the pulse width of the first pulse sequence in each channel being selected based on a desired light color and the nominal pulse width of the second pulse sequence being selected based on a desired brightness. The same second pulse sequence can be applied to each channel.

The following detailed description together with the accompanying drawings will provide a better understanding of the nature and advantages of the present invention.

DETAILED DESCRIPTION

Figure 1:
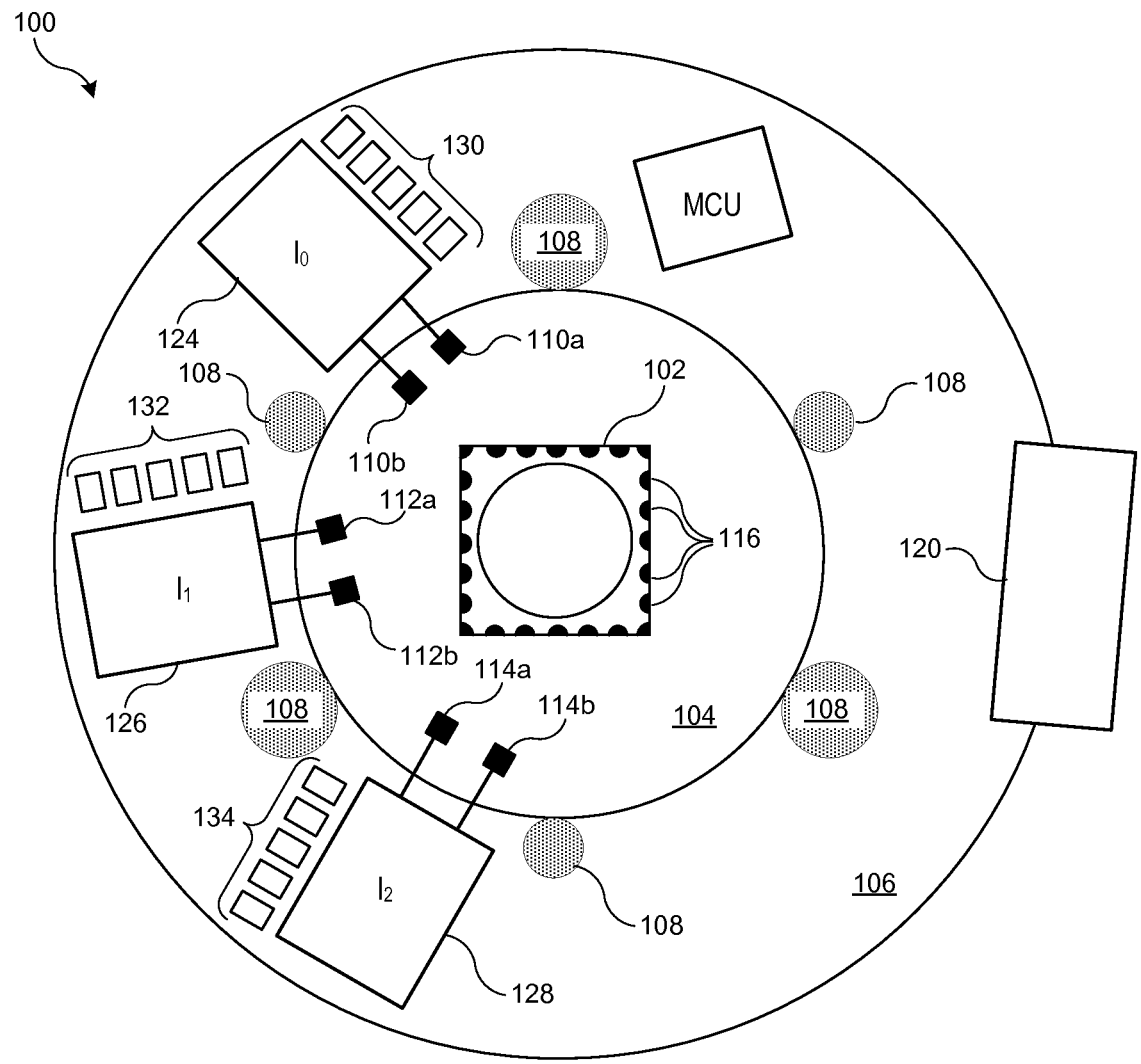
FIG. 1 is a simplified top view of an LED-based light source module according to an embodiment of the present invention.

Certain embodiments of the present invention relate to LED-based light source modules that incorporate color tunability and brightness control. In some embodiments, a user can independently select a desired color temperature and brightness and can change either or both dynamically. To allow dynamic changes in color temperature, the LED-based light source can include a single emitter substrate on which multiple LED dice (also referred to as LEDs) are disposed. The LEDs can be electrically connected into some number of independently addressable groups, with each group producing light of a different color or color temperature. For example, the LEDs can include three groups: one group that emits yellowish light (e.g., blue LEDs with a first quantity of yellow phosphor disposed on a light-emitting surface), one group that emits whitish light (e.g., blue LEDs with a second, smaller, quantity of yellow phosphor disposed on a light-emitting surface), and one group that emits red light (e.g., red LEDs). The groups of LEDs are independently addressable, meaning that the operating current supplied to each group can be independently controlled. By controlling the relative operating current provided to each group, a desired color temperature can be achieved, and by controlling the absolute operating currents, the brightness of the output light can be controlled.

In some embodiments, current control can be provided by generating a separate train of digital pulses for each independently-addressable group of LEDs; each train can include a channel-specific number of pulses having a channel-specific pulse width. The pulse widths can be selected to determine the relative brightness of each group of LEDs (and therefore the color temperature) and the number of pulses in the train can be selected to be the same for all groups, with the number controlling the overall brightness.

In some embodiments, the pulse generation can be implemented using cascading pulse width modulation circuits ("PWMs") and a Buck converter to deliver current to each group of LEDs. A first PWM, also referred to as a "regulator PWM" can generate pulses having a width selected based on the desired relative brightness of each group, and the Buck converter can be used to provide output current. A second PWM, also referred to as a "dimming PWM" can pass through or suppress the output current with a duty cycle that depends on the desired overall brightness. The regulator PWM can operate at a high frequency, e.g., above 100 kHz. The dimming PWM can operate at a lower frequency. For example, to avoid creating flicker visible to the human eye, the dimming PWM can operate at frequencies of around 300 Hz. However, while 300 Hz is faster than the human eye can detect, digital images of the light may pick up flicker artifacts.

To reduce such artifacts, it may be desirable to operate the dimming PWM at a higher frequency. Frequencies in the range from about 0.5 kHz to about 15 kHz overlap with the audio frequency band, and using such frequencies might require additional sound suppression structures, which adds to cost and complexity of the lighting device. Alternatively, the dimming PWM can be operated above the audio frequency band, e.g., at 20 kHz or higher. At such frequencies, the pulse period of the regulator PWM becomes a significant fraction of the pulse period of the dimming PWM. This can create a stepping effect in the brightness of the light as brightness is adjusted. Further, because the pulse width of the regulator PWM can be different for different groups of LEDs at a given time, the stepping effect may also cause the color mix to shift as the brightness is adjusted. Such shifts are readily detectable by the human eye.

Accordingly, some embodiments of the present invention incorporate techniques to reduce the stepping effect. For example, the pulse width of the dimming PWM can be perturbed (or deliberately varied) within an allowed range on each cycle. The allowed range can correspond roughly to one pulse period of the regulator PWM (exact equality is not required). In some embodiments, varying the pulse width can be accomplished by using a hardware or software counter to cycle the dimming PWM through the range of allowed pulse widths. In other embodiments, varying the pulse width can be accomplished by using a random number generator to select a value within the allowed range for each cycle, which can eliminate cycle-to-cycle correlations. The variation in the pulse width of the dimming PWM can smooth out the stepping effect.

Such perturbation techniques can be applied in a variety of situations in which an output of a first PWM is modulated by a second PWM (also referred to as cascading PWMs), including but not limited to controlling a light source. A first sequence of pulses having a high frequency can be modulated using a second sequence of pulses having a lower frequency. The pulse width of the second sequence of pulses can be perturbed from a nominal pulse width on a per-pulse basis, within a perturbation range corresponding to the pulse period of the first sequence of pulses. In one application, the resulting output can be used to drive LEDs in a light source. In some instances, two or more channels of LEDs of different colors can be supported, with the pulse width of the first pulse sequence in each channel being selected based on a desired light color and the nominal pulse width of the second pulse sequence being selected based on a desired brightness. The same second pulse sequence can be applied to each channel. In some embodiments, a pulse pattern can be generated that models an output of cascading PWMs, e.g., by using control software to control one pulse generator.

FIG. 1 is a simplified top view of an LED-based light source module 100 according to an embodiment of the present invention. Light source module 100 includes an emitter 102 that includes multiple independently addressable groups of LEDs, with each group producing light of a different color. Specific examples of LED configurations for emitter 102 are described below.

Emitter 102 is mounted on a central printed circuit board (PCB) 104 that can be physically connected to a peripheral PCB 106. In some embodiments, peripheral PCB 106 can be a separate circuit board that is attached at a mezzanine level above central PCB 104, providing thermal isolation between central PCB 104 and peripheral PCB 106. Alignment holes 108 can be provided through peripheral PCB 106 (and central PCB 104 to the extent that central PCB 104 extends laterally beneath peripheral PCB 106) to facilitate placement of light-source module 100 into a lamp or other light fixture as well as alignment of secondary optics (e.g., a total internal reflection lens or the like), supporting structures, heat sink, etc. Other alignment features can also be provided.

Central PCB 104 can incorporate a metal-core PCB or other structure with high thermal conductivity that can spread and transfer heat generated by emitter 102 during device operation to help maintain the LEDs in emitter 102 at a desired operating temperature. Central PCB 104 can provide electrical connectivity to emitter module 102 via contact pads 110, 112, 114 that connect to traces (not shown) within the body of central PCB 104. These traces in turn can be electrically connected to peripheral contacts 116 of emitter 102.

Peripheral PCB 106 can be a metal-core or other type of PCB and can be thermally isolated from central PCB 104. Peripheral PCB 106 can provide mountings for various components including a connector 120; a microcontroller unit (MCU) 122; current regulators 124, 126, 128; and RC circuit components 130, 132, 134, which can include, e.g., various resistors and capacitors as described below. Additional components, such as additional resistors, capacitors, fuses, power conditioning and/or power distribution components, and so on can also be mounted on peripheral PCB 106. The various components can be connected by traces (not shown) on the surface of and/or internal to peripheral PCB 106 to form appropriate control circuits. Specific examples of control circuits that can be implemented using components mounted on peripheral PCB 106 and traces connecting them are described below.

Connector 120 can be a receptacle-type connector that includes power and ground contacts. Power can be supplied as a constant DC voltage of, e.g., 10 volts. Connector 120 can also provide contacts for analog or digital control signals, e.g., signals indicating a desired brightness level and/or color temperature. These signals can conform to known protocols such as $I^2C$ or other protocols as desired. In some embodiments, connector 120 conforms to a conventional form factor and pin arrangement to facilitate retrofitting of existing light fixtures.

MCU 122 can be a microprocessor, such as a microcontroller, of generally conventional design. In some embodiments, MCU 122 can include a programmable processing core that can execute program-code instructions, which can be stored in onboard memory (e.g., read-only memory, or ROM) of MCU 122 or an external memory. MCU 122 can also be implemented using customized circuits, such as application specific integrated circuits (ASICs), field programmable gate arrays (FPGAs), or the like. In some embodiments, such integrated circuits execute instructions that are stored on the circuit itself. In some embodiments, MCU 122 can be implemented using a single off-the-shelf microcontroller device. Alternatively, a custom device or multiple devices can be used to implement control operations described herein or similar operations.

In operation, MCU 122 can be configured to receive control signals (e.g., signals indicating a desired color and/or brightness of the output light) via connector 120 and determine a desired operating current for each of the independently addressable groups of LEDs in emitter 102. In some embodiments, as described below, MCU 122 includes an independent pulse-width modulation (PWM) output channel for each independently addressable group of LEDs. MCU 122 can determine the appropriate pulse duration and number and/or frequency of pulses to be generated for each channel based on desired characteristics of the output light as specified by the control signals received via connector 120. Examples of control algorithms that can be implemented in MCU 122 are described below.

RC circuit components 130, 132, 134 can include resistors and capacitors that are interconnected to provide a separate RC integrating circuit for each PWM output channel. As described below, the RC integrating circuits can "smooth" the PWM signal on each output into a roughly constant voltage level.

Current regulators 124, 126, 128 can each be integrated circuits or other electronic devices that generate a current in response to an adjustable control voltage provided by the corresponding RC circuit 130, 132, 134. Conventional current regulators can be used. The generated current from each current regulator 124, 126, 128 flows between output terminals connected to respective pads 110, 112, 114 on central PCB 104, thereby providing three independently controlled operating currents to emitter 102. Thus, for example, via traces on central PCB 104, pads 110a and 110b can be connected to a first group of LEDs within emitter 102, pads 112a and 112b to a second group of LEDs within emitter 102, and pads 114a and 114b to a third group of LEDs within emitter 102. While three current regulators and RC circuits are shown, it is to be understood that more or fewer could be used, depending on the number of independently addressable groups of LEDs in emitter 102.

Figure 2A:
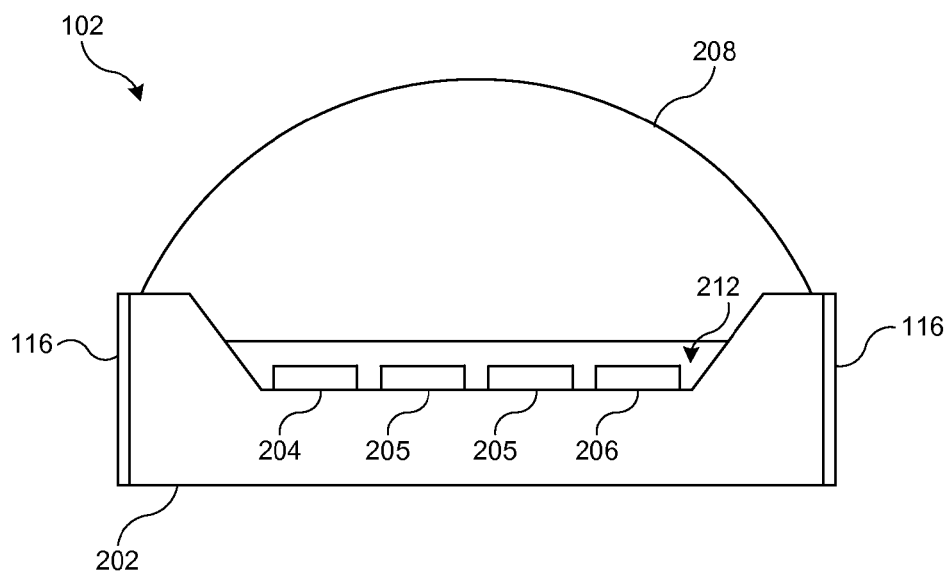
FIG. 2A is a simplified cross-sectional side view of an emitter for a light-source module according to an embodiment of the present invention.
Figure 2B:
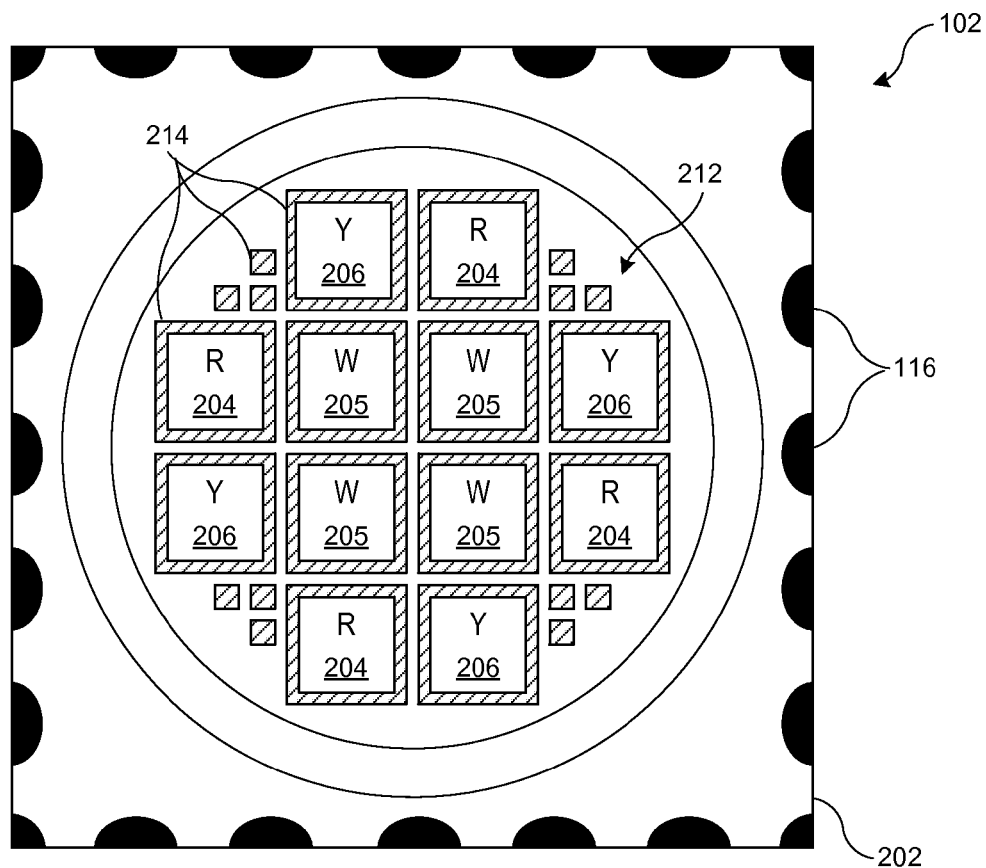
FIG. 2B is a simplified top view of an emitter for a light-source module according to an embodiment of the present invention.

In the embodiment of FIG. 1, emitter 102 provides three independently-addressable groups of LEDs. FIG. 2A is a simplified cross-sectional side view of emitter 102 according to an embodiment of the present invention, and FIG. 2B is a simplified top view of emitter 102 according to an embodiment of the present invention.

Emitter 102 can include a ceramic substrate 202; LEDs 204, 205, 206; and a primary lens 208. LEDs 204, 205, 206 can be light-emitting diodes that generate light of a particular frequency. Any type, color, or combination of LEDs can be used. In some embodiments, three different types of LEDs 204, 205, 206 are used. LEDs 204 can be conventional red LEDs (labeled "R" in FIG. 2B) that emit light with a peak wavelength in the red region of the electromagnetic spectrum (e.g., between about 620 and 645 nm). LEDs 205 can be "whitish" LEDs (labeled "W" in FIG. 2B) that emit a cool whitish light (color temperature around 5300 K). LEDs 206 can be "yellowish" LEDs (labeled "Y" in FIG. 2B) that emit a yellowish or warm whitish light. In some embodiments, whitish LEDs 205 and yellowish LEDs 206 are formed from conventional blue LEDs (e.g., with peak wavelength between about 460 and 490 nm) coated with different amounts of the same yellow phosphor material (e.g., a conventional YAG phosphor with an emission peak wavelength between about 540 and 565 nm). As described below, neither the whitish nor yellowish LEDs are required to produce light along the blackbody locus. Instead, blackbody-like white light can be produced by mixing light from the three groups.

Substrate 202 can be a single-layer or multi-layer ceramic substrate. In some embodiments, substrate 202 is formed from multiple layers of a ceramic material (e.g., alumina) that are patterned with metal traces (not shown), then fused together. Vias can be formed to connect metal traces at different layers. The metal traces can provide electrical connections from LEDs 204, 205, 206 to peripheral contact pads 116. In some embodiments, the metal traces are arranged to provide separate electrical connections to different ones of LEDs 204, 205 206, thereby allowing separate control of different LEDs or groups of LEDs, e.g., to adjust the color of emitted light. Accordingly, red, whitish, and yellowish LEDs 204, 205, 206 shown in FIG. 2B can each be electrically coupled to a different one of current regulators 124, 126, 128 of FIG. 1.

In some embodiments, LEDs 204, 205, 206 are disposed within a circular recess region 212 on the top side of substrate 202. As shown in FIG. 2B, the top surface of substrate 202 within recess region 212 can be patterned with metal contact pads 214 to provide electrical connections to LEDs 204, 205, 206. In some embodiments, LEDs 204, 205, 206 can have wire-bonding contacts (not shown) on the top surface and can be electrically connected to the contact pads 214 by wire bonding. In some embodiments, one or more electrical contacts for an LED 204, 205, 206 may be on the bottom surface of LED 204, 205, 206, allowing LED 204, 205, 206 to be electrically connected to the contact pad 214 on which it is placed. The number and arrangement of metal contact pads 214 and LEDs 204, 205, 206 can be varied as desired.

In some embodiments, substrate 202 can be similar to substrates described in U.S. Patent Application Publication No. 2010/0259930. Other types of substrates can also be used. The dimensions of substrate 202 can be varied as desired, e.g., depending in part on the number and arrangement of LEDs 204, 205, 206. For example, substrate 202 can be square with dimensions of 0.7-5.0 cm on a side (e.g., 0.9 cm in one embodiment) and a thickness of 0.5-2.0 mm (e.g., 1.0 mm in one embodiment).

Primary lens 208 can be used to focus or direct light generated by LEDs 204, 205, 206. In some embodiments, the lower portion of lens 208 is shaped to fit into and partially fill recess region 212 as shown in FIG. 2A. The remainder of recess region 212 can be filled with air or with an optically transparent material, e.g., approximately matching an index of refraction of lens 208. In some embodiments, one or more secondary lenses (not shown), such as a total internal reflection lens, can be used to further shape the light output from emitter 102.

Figure 3:
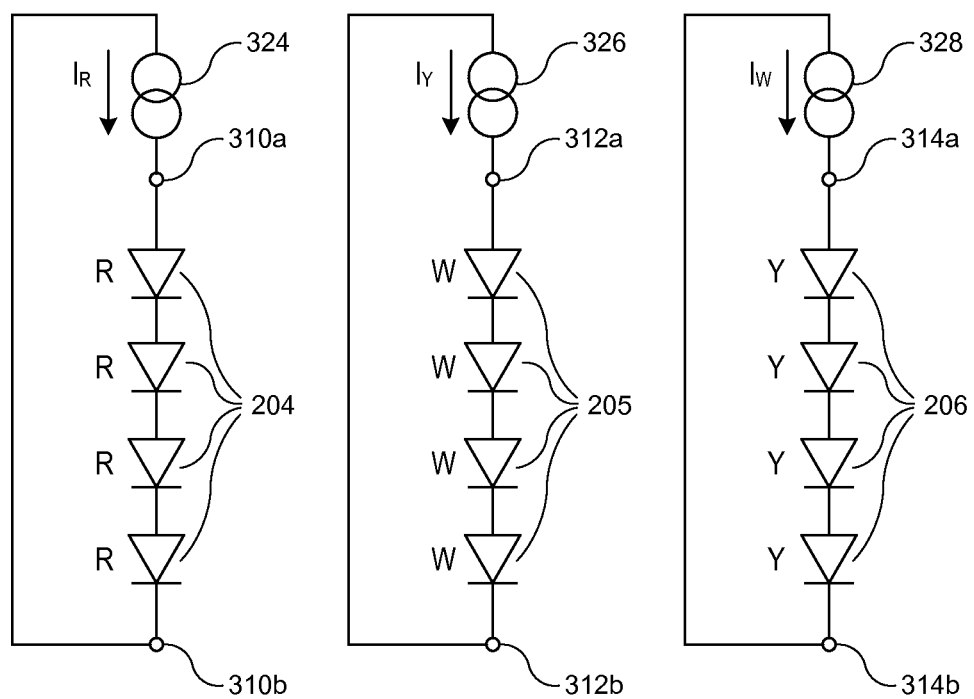
FIG. 3 is a simplified circuit diagram showing electrical connections for LEDs in an emitter according to an embodiment of the present invention.

FIG. 3 is a simplified circuit diagram showing electrical connections for LEDs 204, 205, 206 according to an embodiment of the present invention. As shown, red LEDs 204 can be connected to current source 324 (corresponding to current source 124 of FIG. 1); nodes 310a, 310b can correspond to pads 110a, 110b of FIG. 1. Whitish LEDs 205 can be connected to current source 326 (corresponding to current source 126 of FIG. 1); nodes 312a, 312b can correspond to pads 112a, 112b of FIG. 1. Yellowish LEDs 206 can be connected to current source 328 (corresponding to current source 126 of FIG. 1); nodes 314a, 314b can correspond to pads 114a, 114b of FIG. 1. As described above, these connections can be implemented using metal contact pads 214 connected to metal traces between the layers of ceramic substrate 202 of FIGS. 2A and 2B to establish electrical paths between different groups of LEDs and different ones of peripheral contacts 116. Peripheral contacts 116 can be connected to pads 112a, 112b, 114a, 114b, 116a, 116b via traces in central PCB 104 of FIG. 1.

Figure 4:
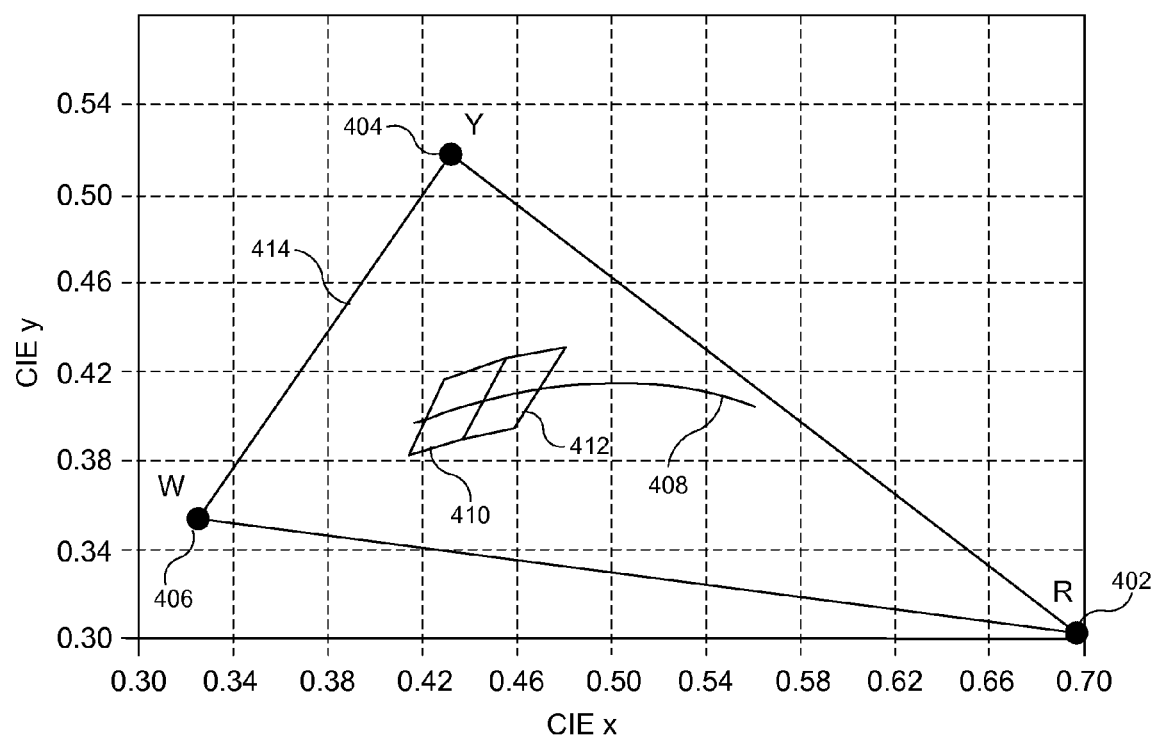
FIG. 4 is a graph of a portion of CIE color space illustrating color tuning according to an embodiment of the present invention.

The color properties of light emitted by emitter 102 can be controlled by adjusting the relative current supplied to each group of LEDs. FIG. 4 is a graph of a portion of CIE color space illustrating color tuning according to an embodiment of the present invention. Point 402 corresponds to an aggregate color emitted by red LEDs 204 of FIG. 2; point 404 to an aggregate color emitted by whitish LEDs 205; and point 406 to an aggregate color emitted by yellowish LEDs 206. It is to be understood that points 402, 404 and 406 are indicative of the aggregate color produced by all the LEDs of a group, which need not correspond to the color produced by any one LED in the group. Also shown for reference is a portion of the blackbody locus 408 (also referred to as the Planckian locus), along which light appears as white to the human eye. Color temperature (also referred to as "CCT") varies along blackbody locus 408 from warmer (lower temperatures) toward the right to cooler (higher temperatures) toward the left. Also shown are representative ANSI color bins 410, 412 corresponding to some of the industry-accepted white light standards.

As shown, all of LEDs 204, 205, 206 can produce light outside ANSI color bins 410, 412. However, the combined light output the three groups of LEDs can be tuned to any color within triangle 414 by adjusting the relative currents supplied to—and consequently the relative brightness of—the three LED groups. Accordingly, the light can be tuned to either of ANSI color bins 410, 412 or to other ANSI color bins (not shown) or to other points along blackbody locus 408. Accordingly, light having a dynamically tunable white color can be provided.

As described above, whitish LEDs and yellowish LEDs can be made from the same type of blue LEDs, and LEDs in the two groups can differ in the amount of yellow phosphor disposed on the light-emitting surfaces. Using a single type of phosphor can allow for higher efficiency (in lumens per watt) as compared to devices that use blue LEDs coated with both yellow and red phosphor, in part because only a single phosphor is used (which can be a high-efficiency phosphor such as YAG) and in part because no attempt is made to tune the light output of either group to the blackbody locus. Red LEDs can provide inherently high efficiency. Consequently, efficiency (e.g., in lumens per watt) for a light source module using these three groups can be around 50% higher than for conventional white LED designs. In addition, the color mixing can provide improvements in color rendering index ("CRI"); in some embodiments, CRI of approximately 90 and R9 (a component of CRI corresponding to saturated red) of 70 or higher can be achieved, as compared to CRI of approximately 80 and R9 of less than 30 for some conventional LED-based light sources. Higher CRI indicates that the resulting light will tend to be more natural-looking.

Tuning to a desired color or CCT within triangle 414 can be achieved by controlling the relative operating currents supplied to the different LED groups. In some embodiments, an automated system can be used to determine the ratio of currents required to obtain a particular desired color temperature, and a color-mixing lookup table can be constructed that specifies the current ratios to be used for a given color temperature. In a manufacturing environment where the color of light produced by a given LED group is reliably consistent from one device to the next, the same lookup table can be applied to all devices manufactured in that environment. Where the color of light is more variable, an automated process and system can be used to determine a lookup table for each emitter, e.g., as part of an emitter manufacturing process. Examples of suitable processes and systems are described in U.S. Patent App. Pub. No. 2012/0286699; other processes and systems can also be used.

Figure 5:
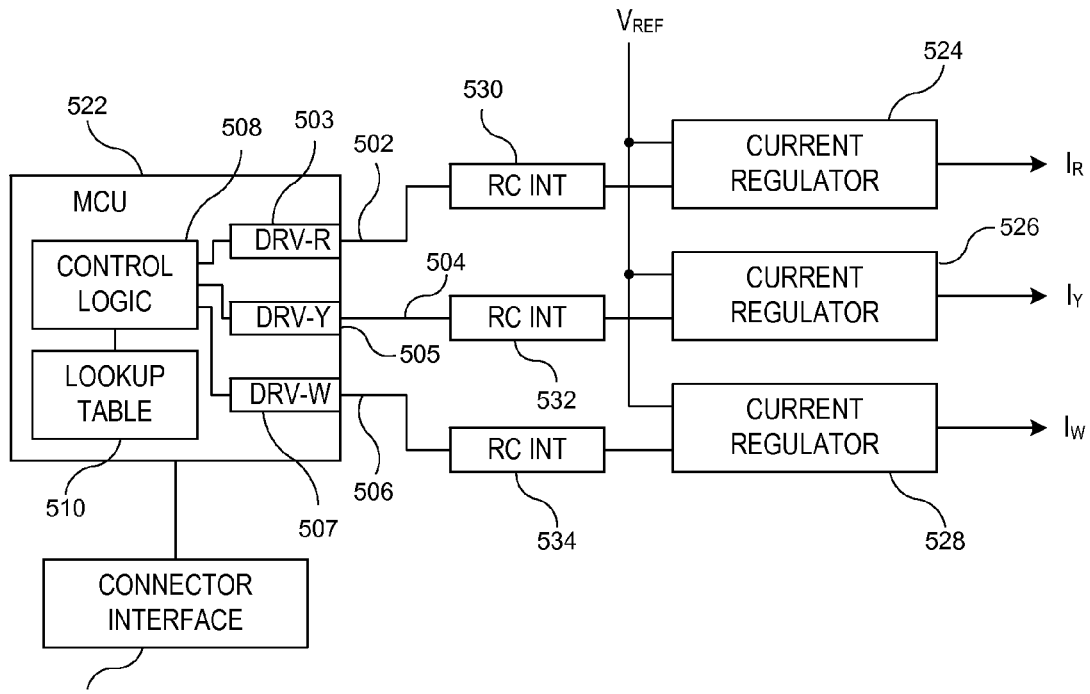
FIG. 5 is a simplified block diagram of current generation circuitry that can be implemented in a light-source module according to an embodiment of the present invention.

In some embodiments, MCU 122 of FIG. 1 can be programmed to use a color-mixing lookup table to determine PWM pulse parameters for each channel, which in turn can be used to generate the operating currents. FIG. 5 is a simplified block diagram of current generation circuitry that can be implemented in light-source module 100 of FIG. 1 according to an embodiment of the present invention.

As shown in FIG. 5, MCU 522 (which can correspond to MCU 122 of FIG. 1) can provide three PWM output signals on paths 502, 504, 506. Control logic 508 within MCU 522 can configure a PWM driver 503, 505, 507 for each PWM output signal path 502, 504, 506 to generate square-wave pulses of controlled pulse width. In some embodiments, control logic 508 can be responsive to color temperature and/or brightness inputs received via connector interface 520, which can incorporate connector 120 of FIG. 1, as well as to a color-mixing lookup table 510, which can be populated as described above with reference to FIG. 4. Examples of specific algorithms that can be implemented in control logic 508 are described below.

Each PWM driver 503, 505, 507 can deliver pulses via one of paths 502, 504, 506 to a corresponding RC integrator circuit 530, 532, 534. These circuits can incorporate components 130, 132, 134 of FIG. 1.

Figure 6:
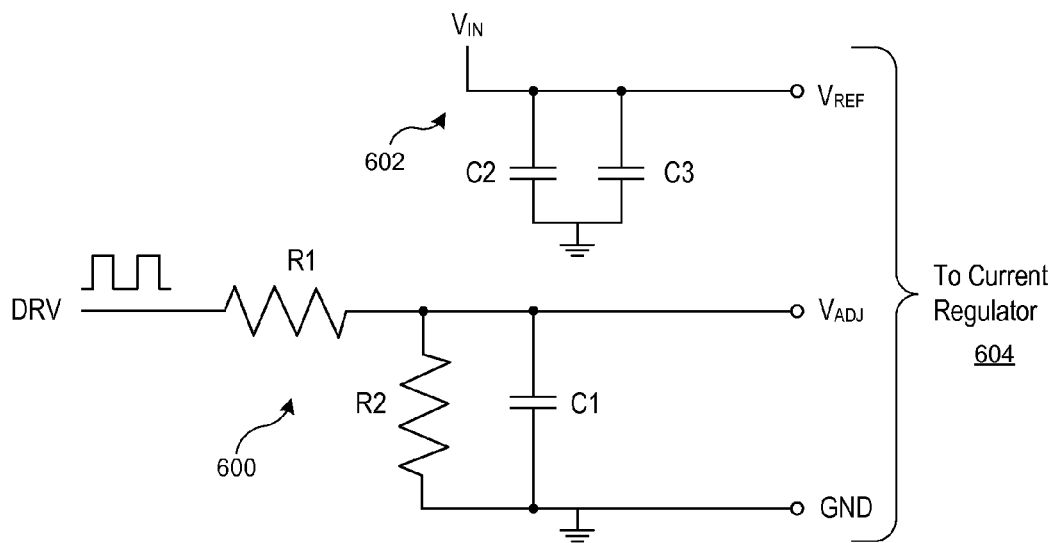
FIG. 6 illustrates an RC integrator circuit that can be used according to an embodiment of the present invention.

FIG. 6 illustrates a representative RC integrator circuit 600 that can correspond to any one of circuits 530, 532, 534 of FIG. 5. Circuit 600 uses resistors R1, R2 and capacitor C1 to generate a voltage $V_{ADJ}$ in response to an input signal DRV (which can correspond to any one of PWM output signals 502, 504, 506 of FIG. 5. $V_{ADJ}$ is provided as the control input to current regulator 604 (e.g., any one of current regulators 524, 526, 528 of FIG. 5), along with a constant reference voltage $V_{REF}$ (e.g., 10 volts or 24 volts) that can be generated by circuit 602 from an external input voltage, which can be provided, e.g., via connector 120 of FIG. 1. Values of resistors and capacitors can be selected as desired for a particular implementation. In one embodiment, R1 can be 2.4 kΩ, R2 can be 2.7 kΩ, C1 can be 0.033 μF, C2 can be 0.1 μF, and C3 can be 0.1 μF. Other values can be substituted.

Those skilled in the art will recognize that RC circuit 600 can operate to time-integrate the square-wave input signal such that the output signal $V_{ADJ}$ is roughly constant. As described below, $V_{ADJ}$ can fluctuate over time, as long as the resulting current fluctuations are sufficiently high in frequency to be imperceptible to a human observer (as a result of time-integration characteristics inherent to human vision).

As shown in FIGS. 5 and 6, RC integrator circuits 530, 532, 534 can each provide an output signal $V_{ADJ}$ as a control input to a current regulator 524, 526, 528, which can correspond to current regulators 124, 126, 128. Conventional current-regulator circuits can be used. In operation, current regulators 524, 526, 528 generate an output current between zero and an upper limit (e.g., 1 A in some embodiments) in proportion to $V_{ADJ}$. For example, the current can vary between zero and the upper limit linearly as $V_{ADJ}$ varies between ground voltage and the reference voltage $V_{REF}$. In some embodiments, a lower limit may be imposed on $V_{ADJ}$ such the output current is zero if $V_{ADJ}$ is below the minimum (e.g., $V_{ADJ}<0.1*V_{REF}$). The output currents $I_R$, $I_W$, $I_Y$ can be provided to the LED groups of emitter 102 as shown in FIG. 3.

Figure 7:
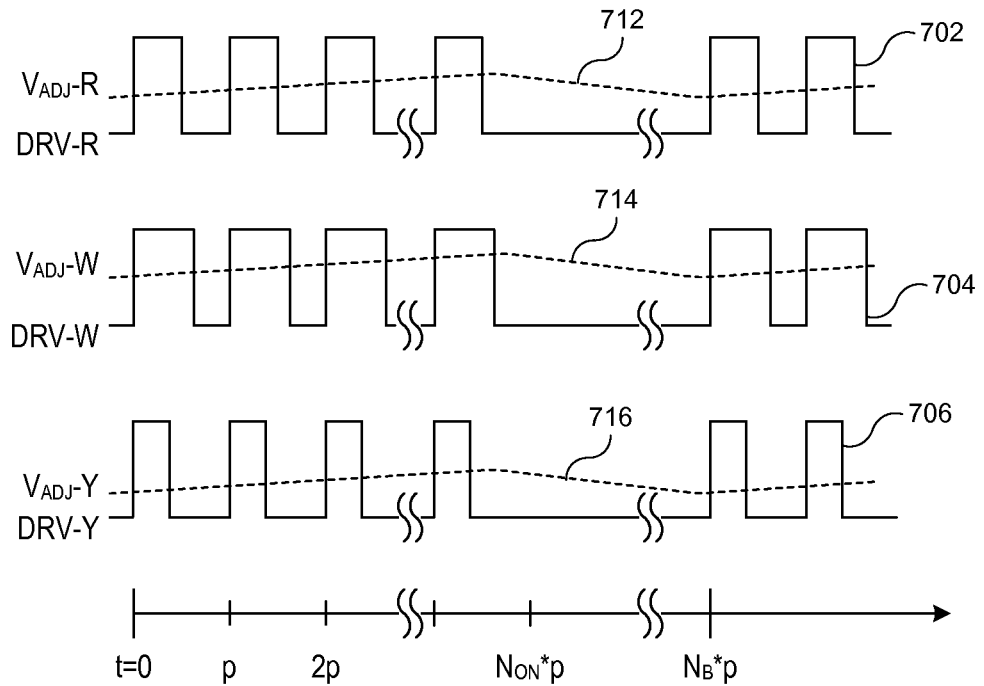
FIG. 7 illustrates controlling brightness using pulse width according to an embodiment of the present invention.
Figure 8:
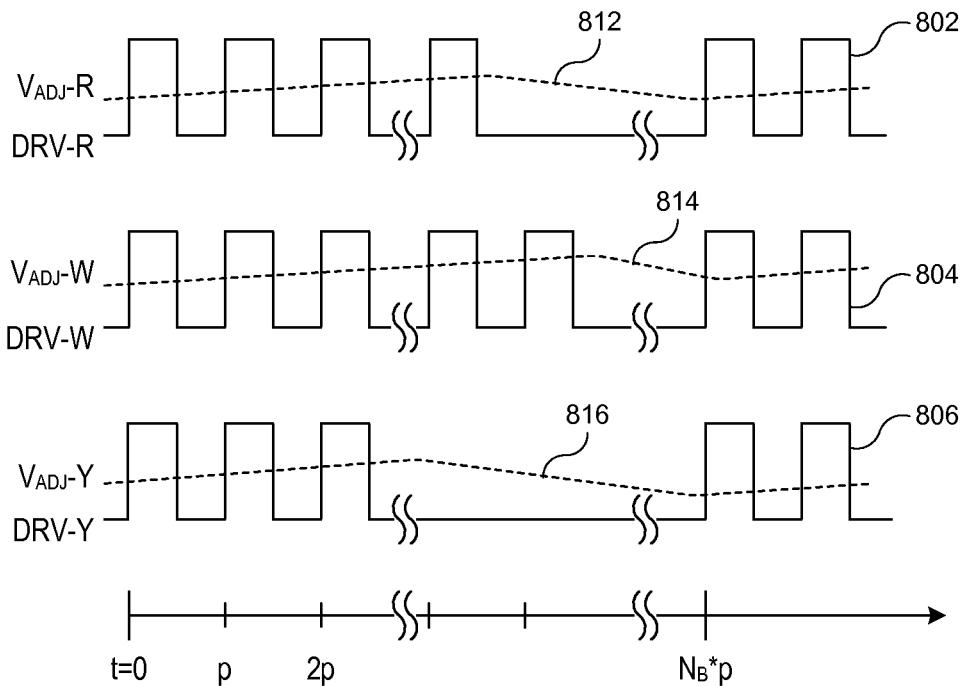
FIG. 8 illustrates controlling brightness using a number of pulses in a pulse train according to an embodiment of the present invention.

In various embodiments, MCU 522 can control the brightness of each LED group (and the overall brightness of the light) by adjusting the characteristics of pulses produced at PWM driver outputs 502, 504, 506. FIGS. 7 and 8 illustrate examples of controlling brightness using PWM pulse characteristics according to embodiments of the present invention.

In FIG. 7, MCU 522 generates pulses on each channel with the same period (p). Pulse period p can be defined in terms of the CPU clock of MCU 522. For example p can be 200 or 256 or some other number of CPU clock cycles. If the CPU clock operates at 8 MHz, then p would be 25 microseconds or 32 microseconds or some other number. (It is to be understood that all numbers used herein are illustrative.) However, the pulses on different channels have different widths; in this example, DRV-W pulses (line 704) are wider than DRV-R pulses (line 702), and DRV-R pulses are wider than DRV-Y pulses (line 706). Accordingly, the RC integrator circuits produce different voltage levels, as indicated by dashed lines 712, 714, 716. Adjusting the relative pulse widths across the channels can result in changing the color mix and therefore the color temperature.

In this example, overall brightness can be controlled by generating a particular number of pulses in a "pulse train" consisting of a number $N_B$ of pulse periods p. The duration of a pulse train ($N_B*p$) is also referred to herein as a "brightness cycle." In one embodiment, $N_B=128$; if the pulse period is 32 microseconds, the brightness cycle has a duration of about 4.1 milliseconds. Within the brightness cycle, as shown in FIG. 7, the first $N_{ON}$ pulses are generated, while the remaining $N_B-N_{ON}$ pulses are suppressed (not generated). $N_{ON}$ can be determined based on the desired brightness and can range, e.g., from 0 to $N_B-1$. Multiple brightness cycles can be executed successively to produce steady-state or time-varying operation of the light source module, and operation can continue as long as desired.

As shown in FIG. 7, the brightness cycle can produce a cyclic fluctuation in the output voltage levels of the RC integrator circuits (dashed lines 712, 714, 716). This can produce corresponding fluctuations in the operating current, which in turn can produce a flickering of the LED brightness. For the parameters given above, the flickering has a frequency that is high enough to be undetectable to the human eye (e.g., 244 Hz for p=32 μs, 312 Hz for p=25 μs).

FIG. 8 illustrates another technique for controlling the brightness of each LED group. In this example, DRV-R pulses (line 802), DRV-W pulses (line 804), and DRV-Y pulses (line 806) all have the same width. However, a different number of pulses is sent on each channel during a brightness cycle: the pulse train for DRV-R (line 802) has one more pulse than that for DRV-Y (line 806), and the pulse train for DRV-W (line 804) has one more pulse than that for DRV-R. Accordingly, the RC integrator circuits produce different voltage levels, as indicated by dashed lines 812, 814, 816. Thus, as with adjusting relative pulse widths, adjusting the relative number of pulses sent on different channels can also result in changing the color mix and therefore the color temperature. Adjusting the number of pulses in the pulse trains on all channels by the same amount can increase or decrease the brightness without affecting color temperature.

It will be appreciated that the light source module described herein is illustrative and that variations and modifications are possible. An emitter can have any number of independently addressable LED groups. For example, one alternative emitter configuration can include four groups of LEDs, e.g., the three groups shown in FIG. 4 plus a "green" group that can have CIE color-space coordinates CIE-x between about 0.31 and 0.34 and CIE-Y between about 0.48 and 0.52. Another configuration has four groups including red, green, blue and yellowish LEDs.

For emitter configurations with three groups, the ratio of operating currents that tunes to a desired location in CIE color space is unique. In a four-group case, there can be infinitely many solutions for tuning to a desired location. Selection among the solutions can be facilitated using other criteria, such as maximizing CRI or a particular component of CRI (e.g., R9), and a lookup table representing the selected solution for each of a set of CCT values can be constructed.

The control circuits described above are also illustrative can be varied as desired. As long as the operating current supplied to each LED group is independently controllable, color mixing and brightness control can be achieved by adjusting the relative currents supplied to different LED groups. Components and component layouts are also provided for purposes of illustration and can be modified as desired. A variety of different control circuits can be used to independently control the operating current supplied to different groups of LEDs.

As shown in FIGS. 7 and 8, MCU 522 (or MCU 122) can control the pulse width of each pulse and/or the number of pulses sent on each channel during a brightness cycle in order to control the operating current supplied to each group of LEDs. MCU 522 can be programmed (or hard-wired) to determine pulse parameters (pulse width and number of pulses) for a pulse train based on input signals indicating a target color temperature (CCT) and/or brightness. Examples of specific algorithms for determining pulse parameters will now be described.

Figure 9:
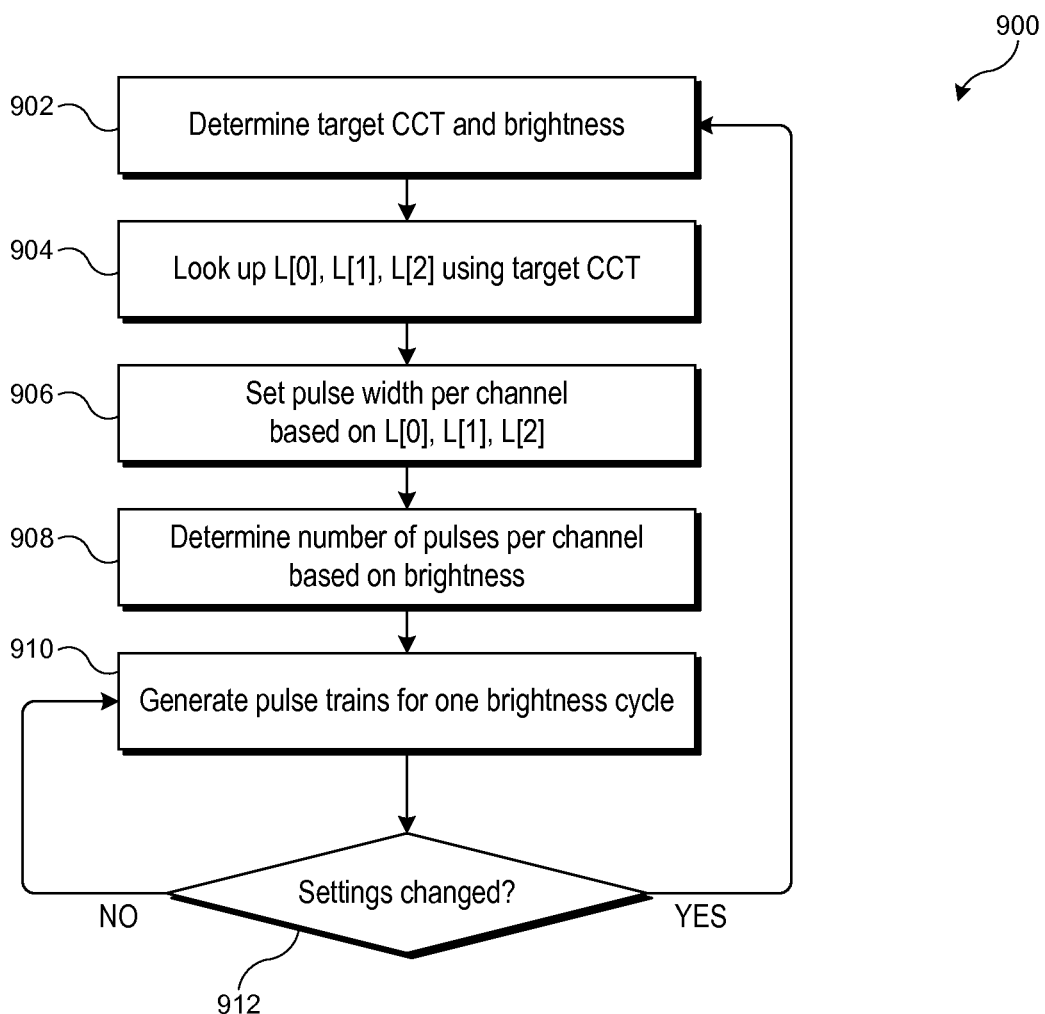
FIG. 9 is a flow diagram of a process for controlling pulse generation according to an embodiment of the present invention.

FIG. 9 is a flow diagram of a process 900 for controlling pulse generation that can be implemented, e.g., in control logic 508 of MCU 522 (or MCU 122), according to an embodiment of the present invention. Process 900 can be executed, e.g., as a continuous control loop for as long as light source 100 is powered.

At block 902, process 900 can determine a target CCT and brightness. For example, as described above, connector 120 of FIG. 1 can be connected to user-operable controls that the user can adjust to a desired color temperature and brightness. These controls can include dials, sliders, keypads (e.g., with arrow keys to indicate an adjustment direction), and so on. In some embodiments, the user-operable controls can be part of a computer-generated graphical user interface, and the computer can communicate appropriate control signals to connector 120. Connector 120 can provide to MCU 122 signals indicating the target CCT and/or brightness based on a current setting of the user-operable controls. In some embodiments, connector 120 can provide "raw" input signals indicating actual control settings, and MCU 122 can interpret the settings to determine target CCT and brightness.

At block 904, MCU 122 can use the target CCT to look up a baseline pulse width parameter for each channel (denoted L[0], L[1], L[2]), e.g., using lookup table 510. For example, MCU 122 can identify the nearest CCT to the target CCT for which a table entry exists. At block 906, MCU 122 can set the pulse width for each PWM driver channel using the baseline pulse width parameters. For example, if the pulse period is 256 CPU clock cycles, each of L[0], L[1], L[2] can be an 8-bit value (0 to 255) indicating the number of clock cycles corresponding to the pulse width.

At block 908, MCU 122 can determine the number of pulses ($N_{ON}$) to send per pulse train (where each pulse train includes $N_B$ consecutive pulse periods) based on the target brightness determined at block 902. For example, for maximum brightness, all $N_B$ possible pulses can be sent on each channel ($N_{ON}=N_B$); for 50% brightness, $N_{ON}=N_B/2$ pulses would be sent, and so on. Linear scaling can be used.

At block 910, MCU 122 can generate a pulse train on each channel for one brightness cycle. As described above, in some embodiments, for each channel, pulses are generated for the first $N_{ON}$ pulse periods of a pulse train, and no pulses are generated for the remaining $N_B-N_{ON}$ pulse periods. In other embodiments, MCU 122 can generate pulses for a different subset of $N_{ON}$ pulses within the $N_B$-period pulse train (e.g., skipping pulse periods according to some pattern such that $N_{ON}$ pulses are relatively evenly distributed across the $N_B$ pulse periods of the pulse train).

At block 912, at the end of a brightness cycle, MCU 122 can determine whether the CCT and/or brightness settings have changed. If not, then MCU 122 can use the current pulse parameters (pulse width and $N_{ON}$ for each channel) to generate another set of pulse trains for another brightness cycle at block 910. If any settings have changed, MCU 122 can return to block 902 to update the pulse parameters based on the new settings. It should be noted that in some embodiments, MCU 122 can determine new pulse parameter values for a next brightness cycle while a current brightness cycle is in progress and store the new values in a buffer, then transfer the buffered parameter values into active control registers of the PWM output drivers before the next brightness cycle begins. Buffering new parameter values can minimize any idle time between brightness cycles while preventing visible artifacts that may occur if parameter values are changed in the middle of a brightness cycle.

Process 900 allows brightness and/or color temperature to be changed in discrete steps and can be limited by the resolution of the lookup table and/or the number of brightness settings ($N_B$ possible options). To increase the tunability of the light source, in some embodiments the control logic in the MCU can interpolate between CCT and/or brightness levels. In such embodiments, the color temperature and overall brightness can be controlled through a combination of relative pulse widths and number of pulses in the per-channel pulse trains.

Figure 10:
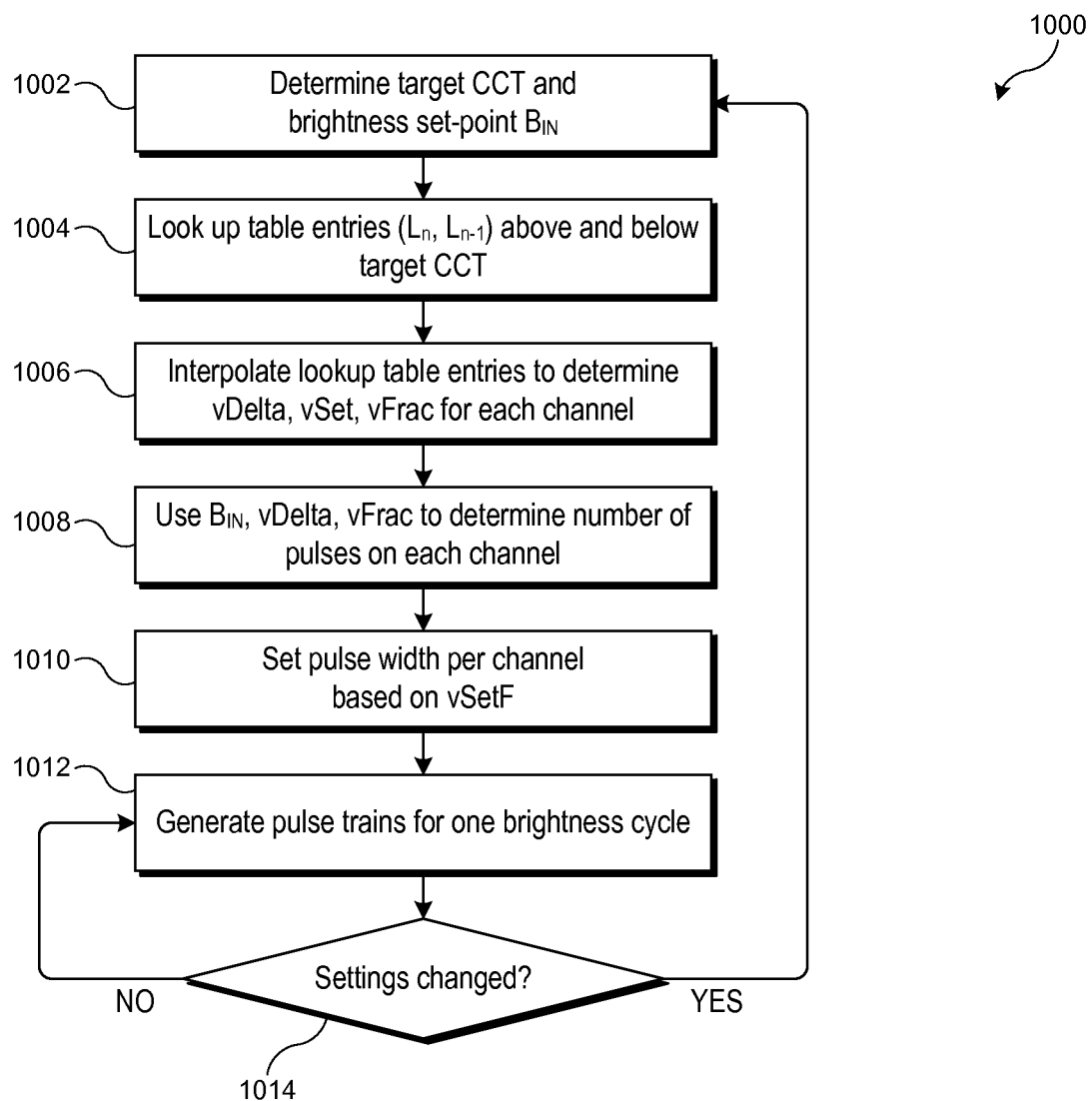
FIG. 10 is a flow diagram of a process for pulse generation according to another embodiment of the present invention.

FIG. 10 is a flow diagram of a process 1000 for pulse generation according to an embodiment of the present invention that uses interpolation to fine-tune CCT and brightness. Like process 900, process 1000 can be implemented, e.g., in control logic 508 of MCU 522. At block 1002, process 1000 can determine a target CCT (tCCT) and brightness set-point ($B_{IN}$); this can be similar to block 902 of process 900 described above. In one embodiment, the target CCT is specified using Kelvin scale color temperatures, and the brightness is specified as an integer in a range from 0 to 1023 (10 bits).

At block 1004, MCU 122 can look up color temperatures above and below the target CCT (denoted $CCT_n$ and $CCT_{(n-1)}$) in a lookup table of relative current values, to obtain two baseline pulse width values for each channel (the two values for one channel are denoted herein as $L_n$ and $L_{(n-1)}$). At block 1006, MCU 122 can interpolate between the two baseline pulse width values for a given channel to determine parameters vDelta, vSet, and vFrac. In one embodiment, these parameters are defined for a single channel by the following pseudocode:

vDelta=$L_n$-$L_{(n-1)}$;
vv=vDelta*[(tCCT−$CCT_n$)<<8]/[$CCT_n$ − $CCT_{(n-1)}$]+ [$L_n$<<8];
vSet=8 most significant bits of vv;
vFrac=8 least significant bits of vv.

At block 1008, MCU 122 can use $B_{IN}$, vDelta, and vFrac to determine the number of pulses to include in a pulse train. In some embodiment, the number of pulses and pulse width are used in a coordinated fashion to control color mixing and brightness. For example, in one embodiment, an interpolation factor sInterP can be defined using the following pseudocode:

if (vDelta>0 && vDelta<4) sInterP=vFrac/vDelta
else sInterP=1.

In one embodiment, pulse width and/or number of pulses can be constrained by a range limit on the current regulator; for instance, as noted above $V_{ADJ}$ may be required to be at least 10% of $V_{REF}$ in order to generate any current, and this can imply a minimum number of pulses per pulse train and/or minimum pulse width to keep $V_{ADJ}$ above this threshold. Accordingly, in one embodiment, a pulse width value vDrvMin is defined that corresponds to $V_{ADJ}$ at threshold, and a floor under pulse width vSet can be established, e.g., using the following pseudocode:

```
if (vSet < vDrvMin) {
    sDrvLimit = vSet/vDrvMin;
    vSetF = 1;
}
else {
    sDrvLimit = 1;
    vSetF = vSet;
}
```

Then one can compute a pulse count $B_{FINAL}$:
$B_{FINAL}$=$B_{IN}$*sInterP*sDrvLimit.

$B_{FINAL}$ can be used to determine the number of pulses ($N_{ON}$) to be included in a pulse train of $N_B$ pulses. For example, in some embodiments $B_{FINAL}$ is a 10-bit number, and there are 128 pulse periods in a brightness cycle. Accordingly, the seven most significant bits (MSBs) of $B_{FINAL}$ can be used to select the number of pulses $N_{ON}$. As described below, the three least significant bits (LSBs) of $B_{FINAL}$ can be used to dither the number of pulses per brightness cycle between $N_{ON}$ and $N_{ON}$+1 over a sequence of brightness cycles, allowing for further fine-tuning of color and brightness.

At block 1010, MCU 122 can set the pulse width for each channel based on the final pulse width vSetF for that channel. For example, if a pulse period is 256 CPU clocks, then vSetF can directly indicate the number of clock cycles corresponding to the pulse width.

It is to be understood that the computations at blocks 1006, 1008, and 1010 are performed independently for each channel, to produce a final pulse width vSetF and pulse count $B_{FINAL}$ for the pulse train in each channel. Process 1000 inherently controls relative brightness to achieve the desired color mix because the same target CCT and brightness set-point $B_{IN}$ are applied to each channel.

At block 1012, MCU 122 can generate a pulse train on each channel for one brightness cycle. As described above, in some embodiments, for each channel, pulses are generated for the first $N_{ON}$ pulse periods of a pulse train, and no pulses are generated for the remaining pulse periods. In other embodiments, MCU 122 can generate pulses for a different subset of $N_{ON}$ pulse periods within the $N_B$-period pulse train (e.g., skipping pulse periods according to some pattern such that the $N_{ON}$ pulses are relatively evenly distributed across the $N_B$ pulse periods of the pulse train).

At block 1014, at the end of a brightness cycle, MCU 122 can determine whether the CCT and/or brightness settings have changed. If not, then MCU 122 can use the current pulse parameters to generate another set of pulse trains for another brightness cycle at block 1012. If any settings have changed, MCU 122 can return to block 1002 to update the pulse parameters based on the new settings. It should be noted that in some embodiments, MCU 122 can determine and buffer pulse parameters for a next brightness cycle while a current brightness cycle is in progress, then transfer the buffered parameters into active control registers of the PWM output drivers before the next brightness cycle begins; this can minimize any idle time between brightness cycles.

It will be appreciated that pulse-parameter computation processes described herein are illustrative and that variations and modifications are possible. Steps described as sequential may be executed in parallel, order of steps may be varied, and steps may be modified, combined, added or omitted. For instance, the particular computations described are illustrative, order of computations can be varied, and computations can be performed in parallel or sequentially as desired, limited only by logical dependencies among computational steps. All numerical values, bit-field widths, and the like are provided for purposes of illustration and are not intended to be limiting.

Figure 11:
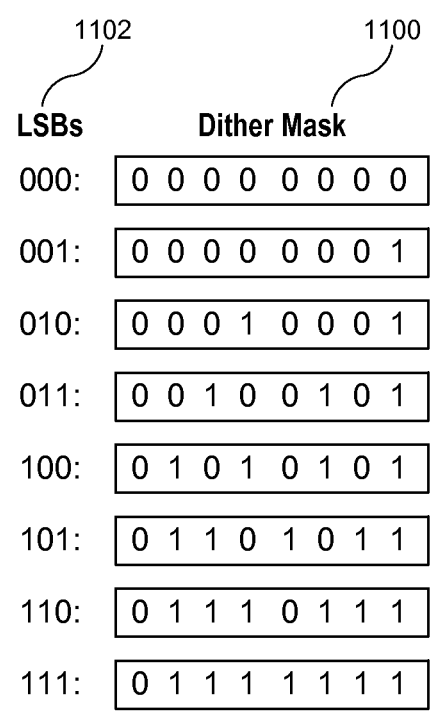
FIG. 11 illustrates a set of dither masks that can be defined to facilitate dithering according to an embodiment of the present invention.

As noted above, in some instances, generating the pulses can incorporate dithering the number of pulses in each channel based on the LSBs of $B_{FINAL}$ in that channel. FIG. 11 illustrates a set of dither masks 1100 that can be defined to facilitate dithering according to an embodiment of the present invention. In this example, each dither mask is 8 bits, and a different dither mask is assigned to each possible combination of LSBs of $B_{FINAL}$ (column 1102).

The dither mask 1100 can be used to define a dither bit for each brightness cycle that is either set (nonzero) or not set (zero); successive brightness cycles can read successive bits of the dither mask. For example, in the case where the LSBs of $B_{FINAL}$ are 100, the dither bit will alternate between set and not set.

Figure 12:
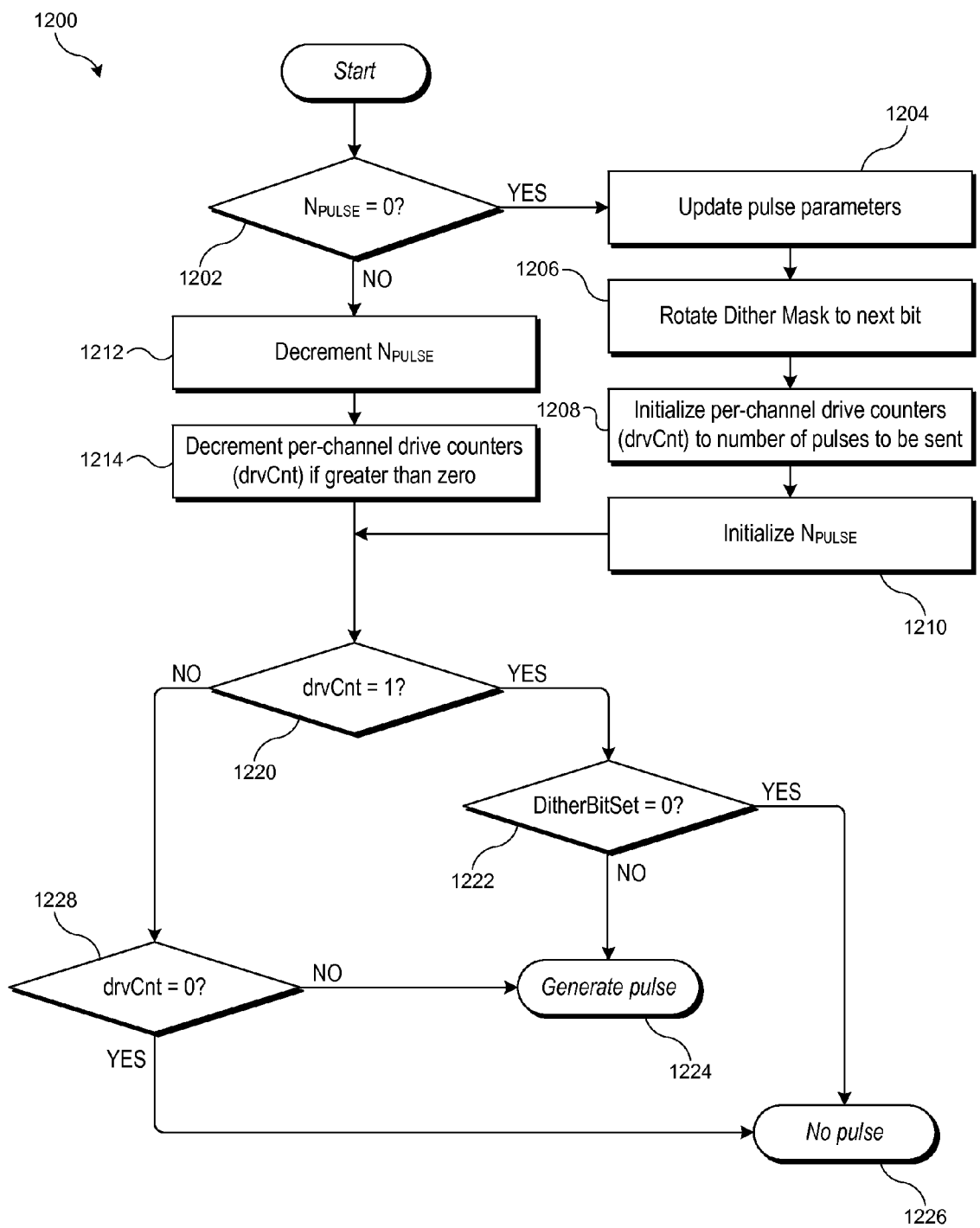
FIG. 12 is a flow diagram of a process for generating pulses for a brightness cycle according to an embodiment of the present invention.

FIG. 12 is a flow diagram of a process 1200 for generating pulses for a brightness cycle according to an embodiment of the present invention. Process 1200 can be implemented, e.g., at block 1012 of FIG. 10 described above. In some embodiments, process 1200 can be implemented as an interrupt service routine that is invoked at regular intervals (e.g., once per pulse period) to generate or not generate a pulse on each channel.

Process 1200 uses a pulse counter $N_{PULSE}$ to determine when a brightness cycle has ended. At block 1202, process 1200 can determine whether a brightness cycle has ended, e.g., by determining whether $N_{PULSE}=0$. If so, then process 1200 can prepare for the next cycle. For example, at block 1204, process 1200 can update the pulse parameters. The updated parameters can be computed, e.g., using process 1000 described above. As described above, process 1000 can compute and buffer new parameter values while a brightness cycle is in progress, and block 1204 can include transferring pulse parameter values from a buffer to active registers of the pulse generator for each channel.

At block 1206, process 1200 can rotate the dither mask for each channel to the next dither bit. In one embodiment, this is done by updating an 8-bit variable dither_m that is initialized to 1. The following pseudocode can be used to rotate the dither mask for a channel:

dither_m<<=1;
if (dither_m==0) dither_m=1;
ditherBitSet=(ditherMask & dither_m).

Here, ditherMask can be the dither mask from FIG. 11, which can be selected on the basis of the 3 LSBs of $B_{FINAL}$ as described above. It should be noted that if the pulse parameters have changed (at block 1204), the dither mask can change while dither_m continues to rotate through its 8 possible states. The same dither_m can be applied to all channels while a channel-specific ditherMask is selected based on the least-significant bits of $B_{FINAL}$ in that channel, providing each channel with its own ditherBitSet.

At block 1208, process 1200 can initialize a drive counter (drvCnt) for each channel to the number $N_{ON}$ of pulses to be generated in the pulse train, e.g., as determined from the MSBs of $B_{FINAL}$. In some embodiments, this initialization is done without regard to the state of the dither bit (ditherBitSet); dithering is applied as described below.

At block 1210, process 1200 can initialize the pulse counter $N_{PULSE}$ to the number of pulse periods in the pulse train for a brightness cycle. In some embodiments, this initial value is a constant (e.g., 128).

Referring again to block 1202, if it is not the end of a brightness cycle, then at block 1212, process 1200 can decrement $N_{PULSE}$, and at block 1214, process 1200 can decrement any per-channel drive counters (drvCnt) that are greater than 0.

At block 1220, process 1200 can determine, for each channel, whether drvCnt has counted down to 1. If so, then dithering becomes an option, and at block 1222, process 1200 can determine whether the dither bit is set for this channel. If the dither bit is set, then at block 1224 a pulse is generated; if not, then at block 1226, no pulse is generated. Where a pulse is generated, the pulse width can be determined using final pulse width vSetF as defined above.

If, at block 1220, drvCnt is not 1, then at block 1228, process 1200 can determine whether drvCnt has counted down to 0. If not, then at block 1224, a pulse is generated; if so, then at block 1226, no pulse is generated. Where a pulse is generated, the pulse width can be determined using final pulse width vSetF as defined above.

Process 1200 can be repeated for each of the $N_B$ pulse periods of a brightness cycle to generate a pulse train in each channel. Accordingly, the first $N_{ON}$ pulses are generated, and the remaining $N_B$-$N_{ON}$ pulses are not generated (plus or minus the dithered pulse). It is to be understood that while steps of process 1200 can be performed for each channel independently (e.g., determining whether drvCnt is zero or whether ditherBitSet is zero), the pulse periods and the beginning/end of each brightness cycle can be synchronized across channels.

It will be appreciated that the pulse generation process of FIG. 12 is illustrative and that variations and modifications are possible. Steps described as sequential may be executed in parallel, order of steps may be varied, and steps may be modified, combined, added or omitted. For instance, different logic can be used to determine when to generate the $N_{ON}$ pulses (or $N_{ON}+1$ in the case of dithering) in a particular channel, e.g., to spread the $N_{ON}$ pulses across the NB periods of the brightness cycle, to generate the last $N_{ON}$ pulses rather than the first $N_{ON}$, or the like. Dithering can be performed or not in each channel as desired.

In some embodiments, dithering can be partially or completely suppressed if the brightness is low, e.g., to avoid flickering effects that may become perceptible to the human eye. For example, dithering can be based on two LSBs rather than three for brightness less than 3% of maximum, one LSB for brightness less than 2% of maximum, and turned off entirely for brightness less than 1% of maximum. Other rules for suppressing dithering can also be used.

Figure 13:
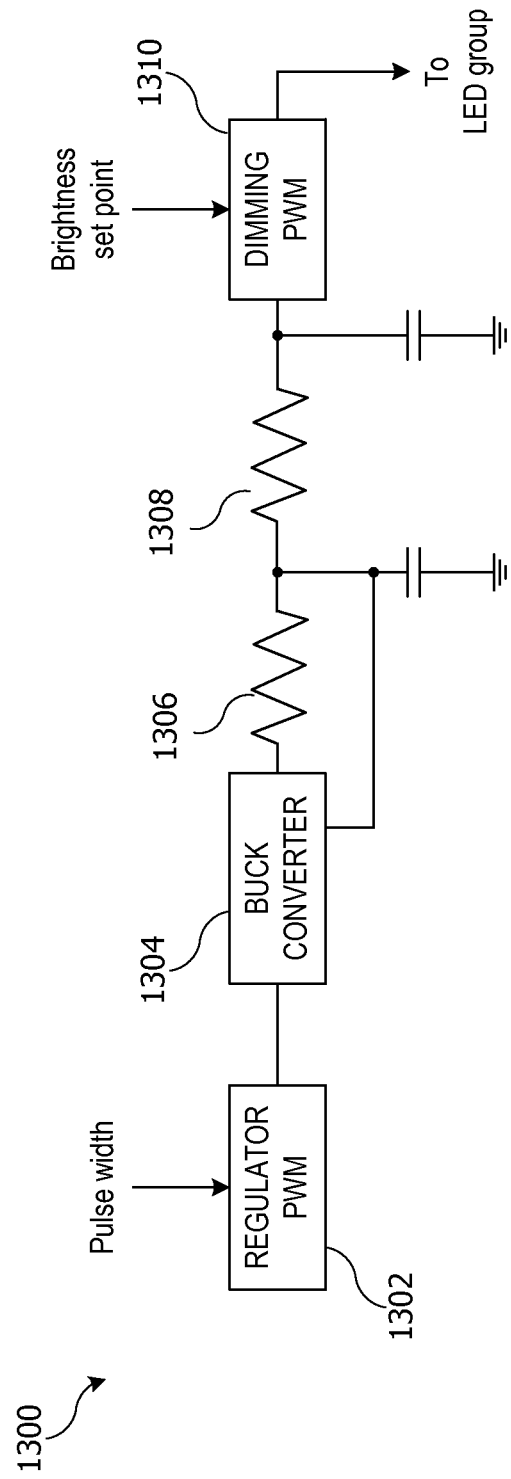
FIG. 13 is a simplified diagram of a circuit arrangement for generating an operating current for one group of LEDs (or channel) according to an embodiment of the present invention.

Another implementation of color tuning and brightness control can use cascaded pulse width modulation circuits (PWMs). FIG. 13 is a simplified diagram of a circuit arrangement 1300 for generating an operating current for one group of LEDs (or channel) according to an embodiment of the present invention. It is to be understood that a similar arrangement can be implemented for each group of LEDs.

"Regulator" PWM 1302 can be based on a pulse-width modulation circuit of conventional design and can produce pulses at a high frequency (e.g., 100 kHz, 300 kHz, or the like). The pulse width can be controlled by a pulse width input as shown, which can be selected to provide the desired relative intensity across different colors as described above. In some embodiments, the pulse width input can be provided using a microcontroller similar to MCU 522 described above with reference to FIG. 5. For instance, regulator PWM 1302 can correspond to or be substituted for any one of driver circuits 503, 505, 507.

Pulses output from regulator PWM 1302 can be input to a Buck converter 1304, which can be of generally conventional design and can produce a regulated output current through resistors 1306, 1308.

"Dimming" PWM 1310 can incorporate a pulse-width modulation circuit of conventional design and can modulate the input current from resistor 1308 using pulses having a low frequency relative to regulator PWM 1302 (e.g., 20 kHz, 30 kHz or the like). Dimming PWM 1310 can adjust its pulse width responsive to a brightness set point input indicative of the brightness (e.g., user input $B_{IN}$ or target brightness $B_{FINAL}$ as described above). The output of dimming PWM 1310 can provide the operating current for a group of LEDs. In operation, dimming PWM 1310 can have the effect of suppressing some of the current pulses generated by regulator PWM 1302 and Buck converter 1304.

Thus, circuit arrangement 1300 can provide color tuning and dimming that can be controlled using techniques similar to those described above.

Circuit arrangement 1300 (as well as numerous other circuit arrangements that incorporate cascaded PWMs) is subject to a stepping effect. That is, as the pulse width of dimming PWM 1310 is increased (or decreased), brightness does not increase (or decrease) smoothly.

Figures 14A, 14B, 14C, 14D, 14E:
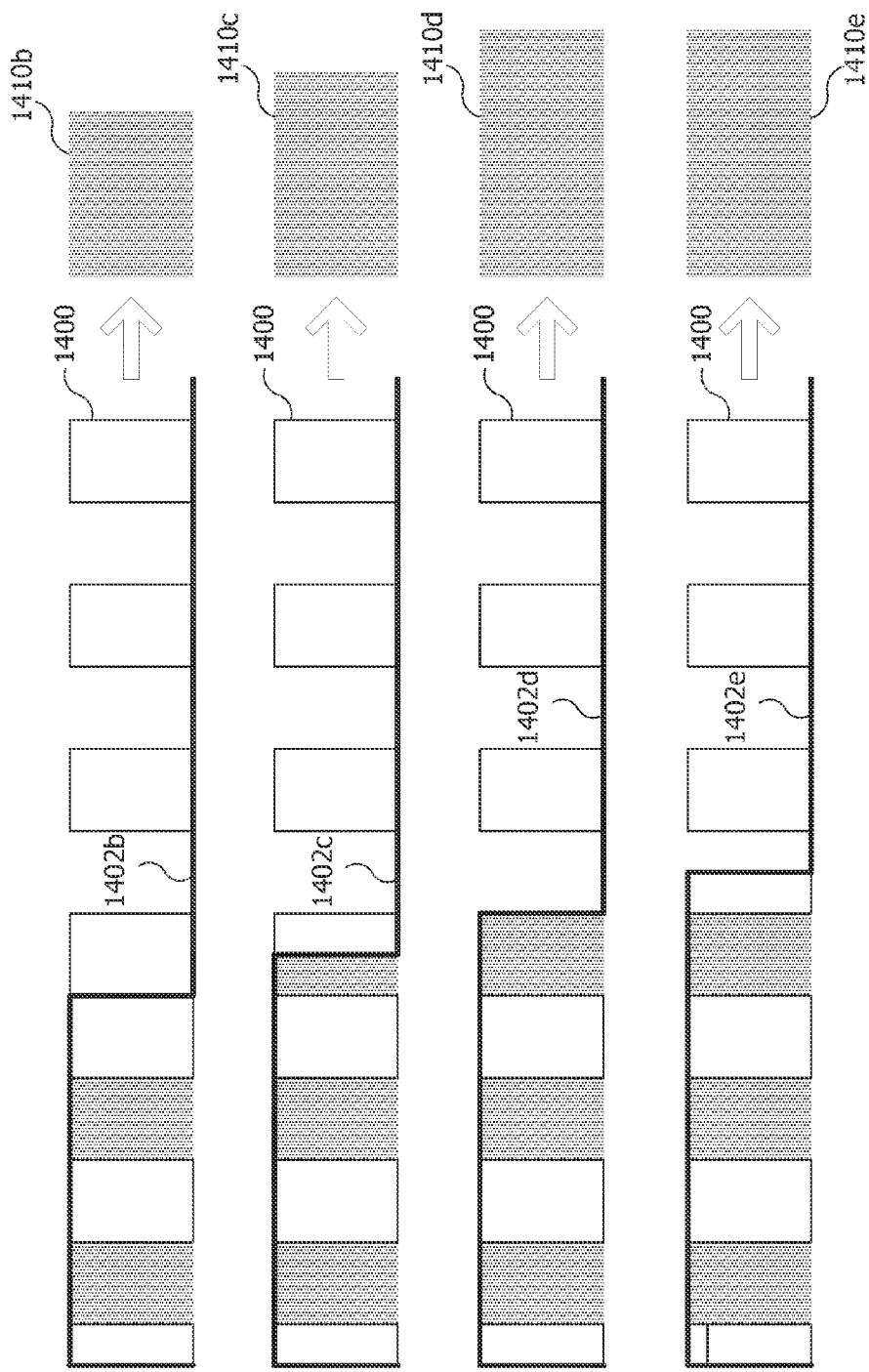
FIGS. 14A-14E illustrate a stepping effect that can occur with the arrangement shown in FIG. 13.

FIGS. 14A-14E illustrate the stepping effect. Line 1400 represents a series of pulses generated by regulator PWM 1302 during an arbitrary time interval. As shown in FIG. 14A, each pulse has a duration (or width) $t_{ON}$ and is followed by an idle time $t_{OFF}$; the total pulse period T is equal to $t_{ON}+t_{OFF}$, and the duty cycle can be defined as $t_{ON}/T$.

Shown in FIGS. 14B-14E are effects of dimming PWM 1310 on brightness for different pulse widths of dimming PWM 1310. Lines 1402b, 1402c, 1402d, 1402e each represent a different pulse width for dimming PWM 1310, which is on (i.e., generating a pulse) during the first portion of the time interval illustrated and off (i.e., not generating a pulse) during the second portion.

In FIG. 14B, two pulses of regulator PWM 1302 contribute to the total brightness, which is represented at the right end of the line as block 1410b. In FIG. 14C, two pulses of regulator PWM 1302 plus a portion of a third contribute, and brightness 1410c is higher than brightness 1410b. In FIG. 14D, three full pulses of regulator PWM 1302 contribute, and brightness 1410d is higher than brightness 1410c. In FIG. 14E, although the pulse width represented by line 1402e is greater than that represented by line 1402d, brightness 1410e is the same as brightness 1410d because the wider pulse width does not overlap with additional pulses of regulator PWM 1302. This creates a "step" in the brightness increase as the pulse width of dimming PWM 1310 increases, i.e., a region where varying the pulse width of dimming PWM 1310 has no effect on brightness.

Figure 15:
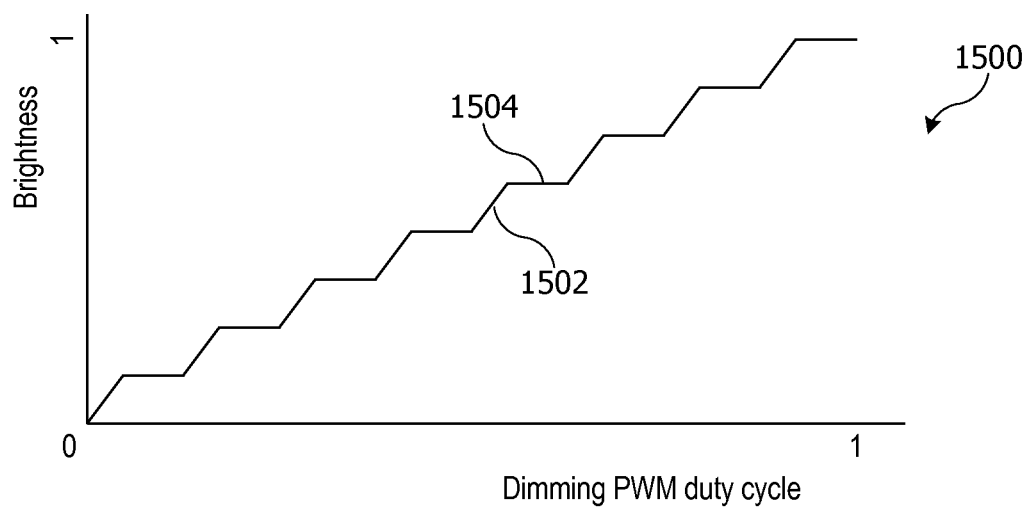
FIG. 15 is a graph further illustrating the stepping effect shown in FIGS. 14A-14E.

It should be noted that the stepping effect can occur regardless of the particular pulse width of either regulator PWM 1302 or dimming PWM 1310. FIG. 15 illustrates the effect as a graph 1500 showing brightness (on a scale from 0 to 1, where 1 is full brightness) as a function of the duty cycle of dimming PWM 1310 (on a scale from 0 to 1 where 1 is the maximum duty cycle). In this graph, it is assumed that regulator PWM 1302 operates at constant pulse width and only the duty cycle of dimming PWM 1310 is varied. Sloped regions (e.g., region 1502) correspond to conditions such as shown in FIGS. 14C and 14D, where an increase in the pulse width (or duty cycle, assuming a fixed pulse period) of dimming PWM 1310 results in an additional portion of a pulse from regulator PWM 1302 being passed through. Flat regions (e.g., region 1504) correspond to conditions such as shown in FIGS. 14D and 14E, where an increase in the pulse width (or duty cycle) of dimming PWM 1310 does not result in any additional portion of a pulse from regulator PWM 1302 being passed through.

For some operating conditions, the stepping effect might not be noticeable. In some embodiments, regulator PWM 1302 can operate at frequencies that may be on the order of several hundred to a thousand times the frequency of dimming PWM 1310; for instance, regulator PWM 1302 can operate at a frequency in the range from 100-500 kHz while dimming PWM 1310 operates at a frequency around 300 Hz. Where this is the case, steps 1504 may be comparable to or less than one increment of the pulse width of dimming PWM 1310, and the stepping effect can be negligible.

In some embodiments, however, it may be desirable to operate dimming PWM 1310 at a frequency that is a larger fraction of the frequency of regulator PWM 1302. For instance, operating dimming PWM 1310 at a frequency around 300 Hz suffices to eliminate flicker for the human eye. Some digital imaging devices, however, are sensitive to brightness fluctuations in this frequency range; for instance, a video image might have a "rolling" intensity artifact due to such fluctuations. One way to avoid such artifacts is by increasing the operating frequency of dimming PWM 1310. Because frequencies from about 500 Hz to about 15 kHz overlap with the audio frequency spectrum of the human ear, any operation in this frequency band might produce an audible sound. Thus, it may be desirable to operate dimming PWM 1310 at a frequency above the audio band, e.g., around 20 kHz or higher. Under such conditions, the operating frequency of regulator PWM 1302 might be only be around 10 to 20 times that of dimming PWM 1310. As the frequency of dimming PWM 1310 becomes larger relative to that of regulator PWM 1302, the stepping effect shown in FIGS. 14A-14E and 15 can become noticeable.

Further, although FIGS. 14A-14E and 15 show the stepping effect in one channel, it is understood that there can be multiple channels, each with its own regulator PWM 1302. To provide color tuning, the regulator PWMs may be generating pulses of different widths. The same dimming pulse modulation can be applied on each channel. This in turn means that the stepping effect would be different on different channels due to the difference in regulator PWM pulse widths. The result is that as brightness changes, the color may also fluctuate. Even small color fluctuations are detectable by the human eye, which can make a stepping effect undesirable.

Accordingly, some embodiments of the present invention implement techniques that can reduce stepping effects. One such technique includes deliberately varying (also referred to as perturbing) the width of the dimming PWM pulse from one pulse to the next, within a range that corresponds to the pulse period of the regulator PWM.

For instance, a perturbation range parameter ($P_{MAX}$) can be defined, based on the ratio of the frequencies of the regulator PWM to the dimming PWM. A dimming PWM can have a pulse width that is adjustable in some number K of steps from zero to maximum duty cycle. If the regulator PWM operates at Q times the frequency of the dimming PWM, then a range of K/Q steps would correspond to one pulse period of the regulator PWM. In one embodiment, K=1024 and Q=25; K/Q is approximately 40, and $P_{MAX}$ can be set to 40. It should be noted that $P_{MAX}$ can but need not exactly correspond to one pulse period of the regulator PWM. The perturbation range $P_{MAX}$ can be derived from the operating frequencies of the two PWMs and does not depend on the pulse widths. Accordingly, in implementations where the PWM operating frequencies are fixed, $P_{MAX}$ can be a constant system parameter, and no onboard logic is required to compute it. (In embodiments where one or both of the PWMs operates at a variable frequency, logic to determine $P_{MAX}$ based on the selected operating frequencies.)

Based on the brightness set point, a nominal pulse width ($B_0$) for the dimming PWM can be selected. For instance, techniques similar to those described above for computing $B_{FINAL}$ can be used. A perturbation P in the range $[-P_{MAX}/2, P_{MAX}/2)$ can be generated and added to $B_0$ to determine the actual pulse width for dimming PWM 1310. A different perturbation P can be generated for each pulse cycle such that P is uniformly distributed in its allowed range.

Figure 16:
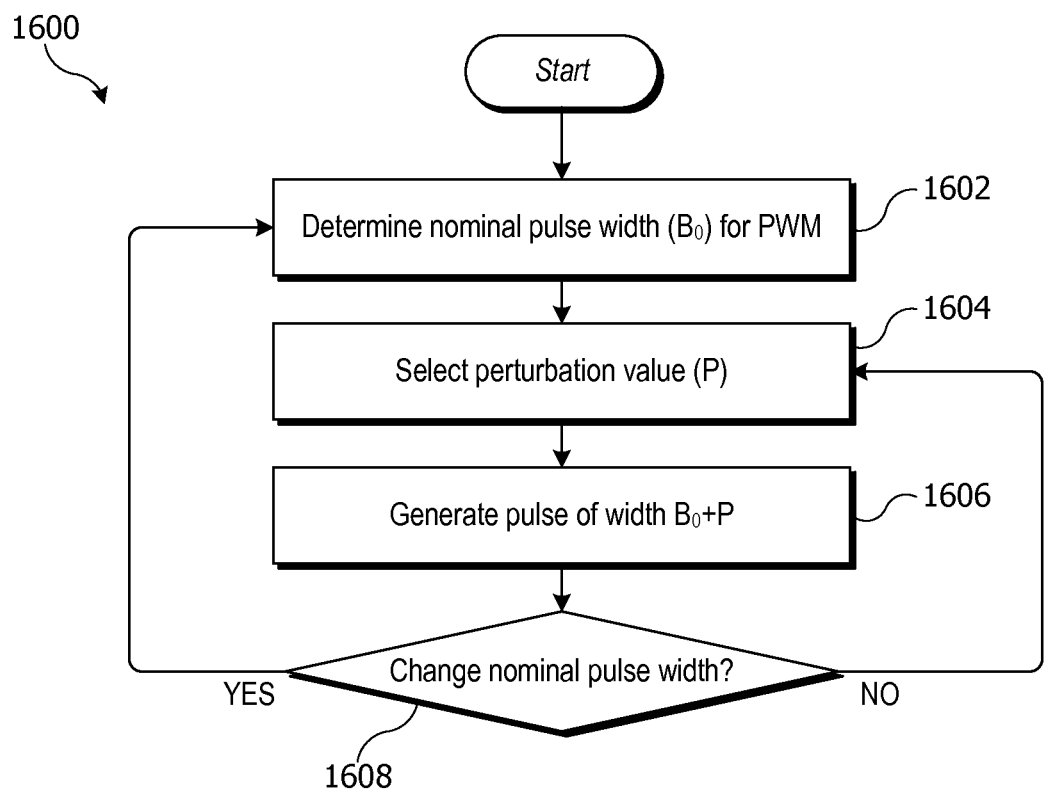
FIG. 16 is a flow diagram of a process for perturbing a pulse width according to an embodiment of the present invention.

FIG. 16 is a flow diagram of a process 1600 for perturbing a pulse width of a PWM (such as dimming PWM 1310) according to an embodiment of the present invention. Process 1600 can operate in a continuous loop that is executed once per pulse of dimming PWM 1310. At block 1602, process 1600 can determine a nominal duty cycle or pulse width $B_0$ for the PWM. For example, techniques similar to those described above for computing $B_{FINAL}$ can be used. The pulse width can be defined, e.g., in unit steps.

At block 1604, process 1600 can select a perturbation value (P) to be applied to the current pulse. The perturbation value can be selected to be uniformly distributed over the allowed range (e.g., from $[-P_{MAX}/2, P_{MAX}/2)$ or the like), defined in unit steps. In some embodiments, selection can be made using a cyclical counter such that each pulse is one count longer than the preceding, until the upper end of the range is reached, at which time the next pulse is at the low end of the range. Alternatively, a random number generator (which can be a true random number generator or a pseudorandom number generator as desired) can be used to generate a random number uniformly distributed within the allowed range.

At block 1606, process 1600 can generate a pulse of width $B_0+P$. Conventional pulse generation techniques can be used.

At block 1608, process 1600 can determine whether the nominal pulse width should be changed. For example, if the brightness set point has changed, then the nominal pulse width should be changed. If the nominal pulse width should be changed, process 1600 can return to block 1602 to determine the new nominal pulse width. If the nominal pulse width should not be changed, process 1600 can return to block 1604 to select a new perturbation value. In this manner, a different perturbation value can be selected as each pulse is generated, so that over time, the pulse widths will be distributed across the allowed perturbation range.

It will be appreciated that process 1600 is illustrative and that variations and modifications are possible. Steps described as sequential may be executed in parallel, order of steps may be varied, and steps may be modified, combined, added or omitted. The perturbation range can be defined as desired, for example, relative to the pulse period of the upstream PWM (e.g., regulator PWM 1302). Those skilled in the art will also recognize that this technique can be applied to remove stepping effects in any context involving cascading PWMs and need not be limited to light sources or lighting control.

Examples of specific hardware and software implementations of process 1600 are described below.

FIGS. 17A-17D show the effect on brightness of introducing perturbations P for different nominal pulse widths $B_0$. Line 1700 represents a series of pulses generated by regulator PWM 1302 during an arbitrary time interval. Dark line 1705 represents a pulse of dimming PWM 1310 of width $B_0$, and vertical bars 1710 represent possible actual falling edges of the pulse of dimming PWM 1310 due to perturbation P.

Figure 17A:
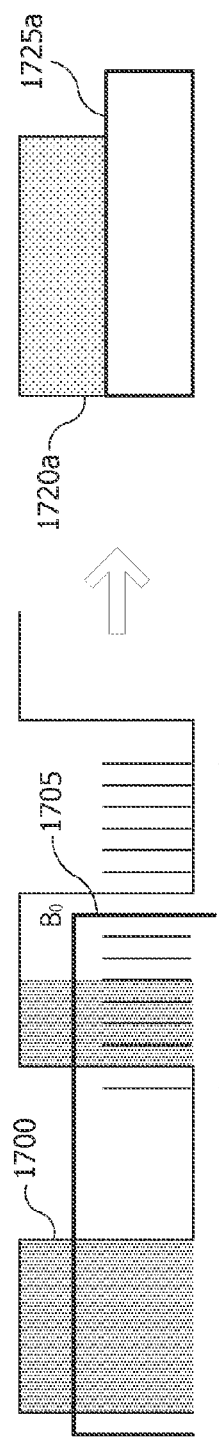
FIGS. 17A-17D show an effect of perturbing pulse widths used to modulate another sequence of pulses according to an embodiment of the present invention.

FIG. 17A shows a case where the nominal falling edge ($B_0$) of dimming PWM pulse 1705 occurring during a regulator PWM pulse 1700. Average brightness over time resulting from perturbations 1710 is represented as block 1720a. For comparison, the nominal brightness (if all pulses had width $B_0$) is shown as block 1725a. In this case, the perturbed brightness is less than the nominal brightness.

Figure 17B:
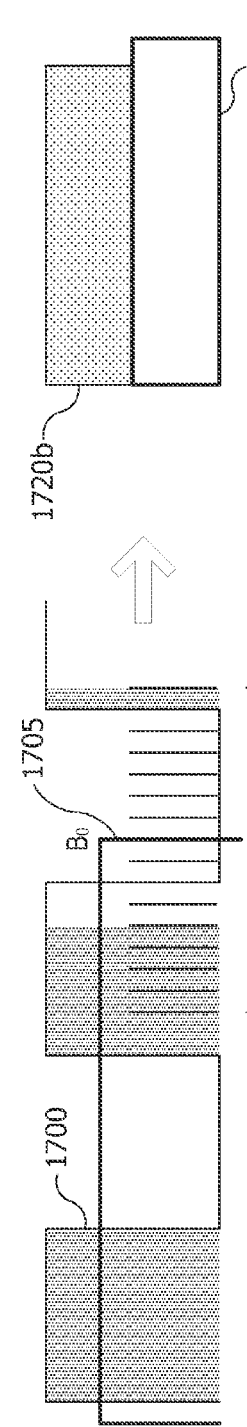
Figure 17C:
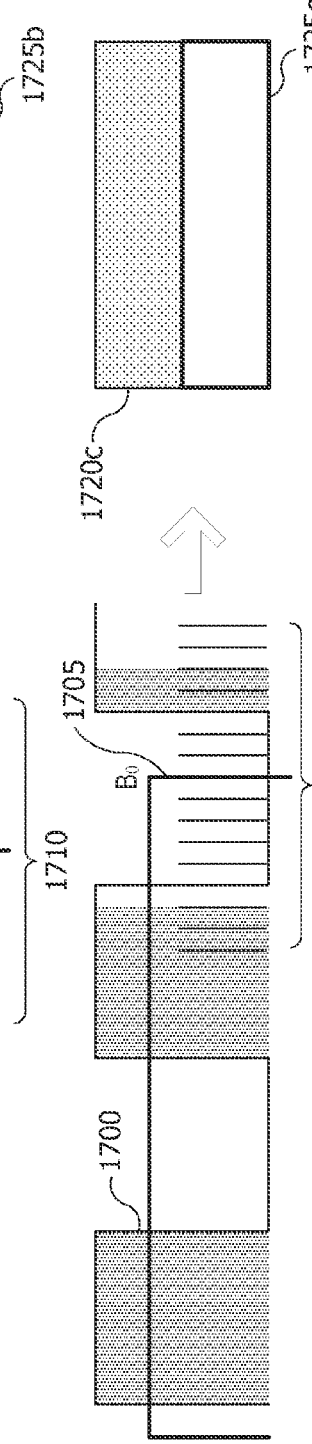
Figure 17D:
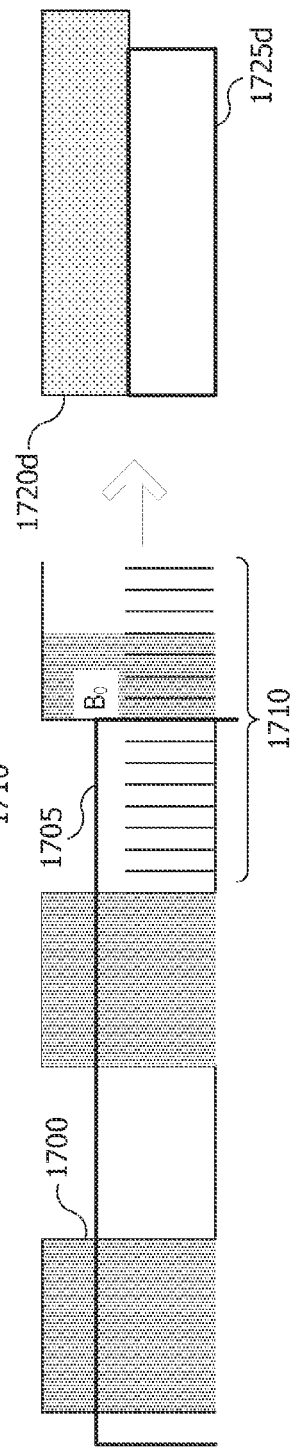

FIGS. 17B-17D show three different cases where the nominal falling edge ($B_0$) of dimming PWM pulse 1705 occurs between regulator PWM pulses 1700. Average brightness over time resulting from perturbations 1710 is represented for each case as blocks 1720b-d. For comparison, the nominal brightness (if all pulses had width $B_0$) for each case is shown as rectangles 1725b-d. It should be noted the nominal brightness is the same in all three cases; however, the perturbations have different effect such that average brightness increases as the nominal falling edge occurs later in time. This results in reducing the stepping effect described above.

Figure 18:
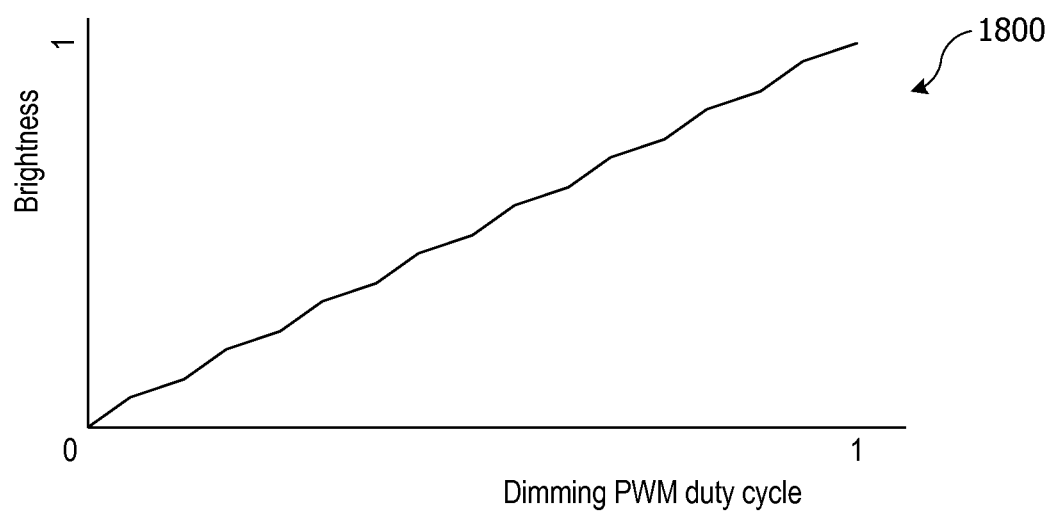
FIG. 18 is a graph further illustrating the effect shown in FIGS. 17A-17D.

To further illustrate the reduction in the stepping effect, FIG. 18 illustrates the effect as a graph 1800 showing brightness (on a scale from 0 to 1, where 1 is full brightness) as a function of the duty cycle of dimming PWM 1310 (on a scale from 0 to 1 where 1 is the maximum duty cycle). In this graph, similarly to FIG. 15, it is assumed that regulator PWM 1302 operates at constant pulse width and only the duty cycle of dimming PWM 1310 changes. The stepping effect evident in FIG. 18 has been significantly reduced.

Perturbation of dimming PWM pulse widths within an allowed perturbation range can be implemented using hardware and/or software. Examples will now be described.

Figure 19:
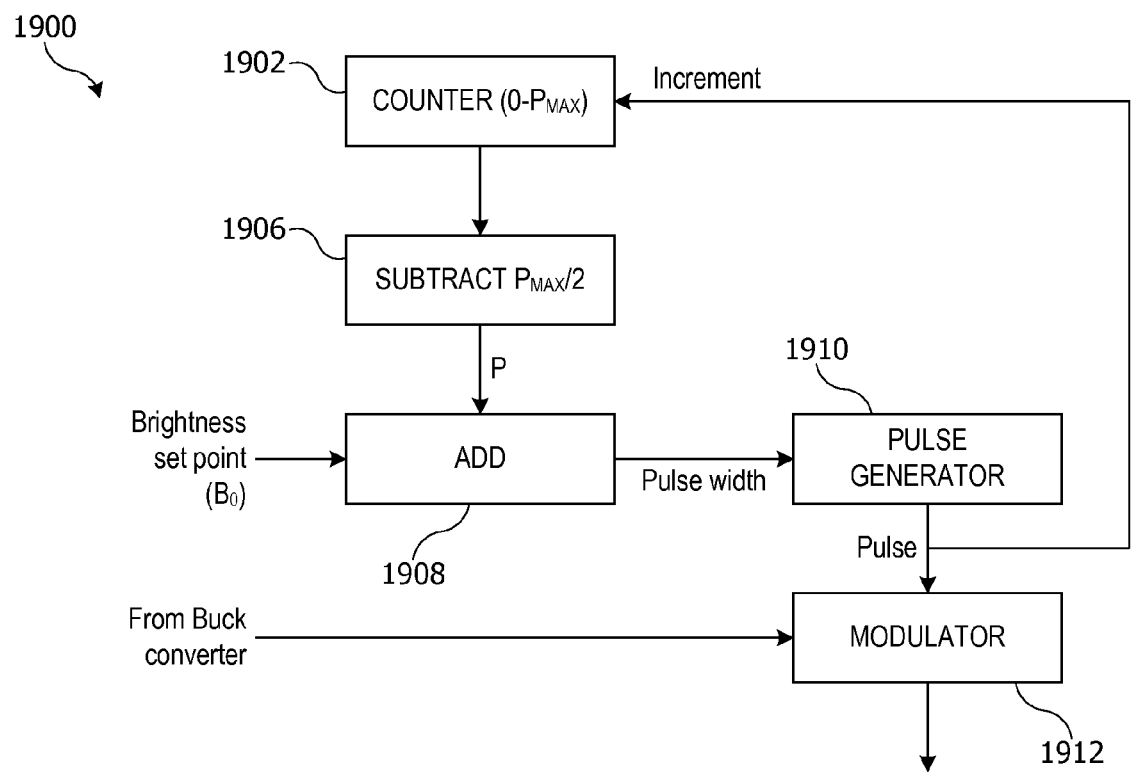
FIG. 19 is a simplified diagram of a hardware system for perturbing pulse width according to an embodiment of the present invention

FIG. 19 is a simplified diagram of a hardware system 1900 implementing process 1600 according to an embodiment of the present invention. Hardware system 1900 can be used, e.g., in implementing dimming PWM 1310 of FIG. 13. Hardware system 1900 includes a cyclical counter 1902 that can count incrementally from 0 to a set upper limit $P_{MAX}$. The counter can be cyclical in that once $P_{MAX}$ is reached, the counter resets to zero and begins counting again. (The counter can count up or down as desired.) In some embodiments, $P_{MAX}$ can be a programmable upper limit; in other embodiments, an upper limit can be built into the counter (e.g., a 6-bit counter would have a natural upper limit at 63).

Subtraction circuit 1906 can shift the range of outputs of counter 1902, e.g., by subtracting $P_{MAX}/2$, to generate a perturbation P. Alternatively, counter 1902 can be configured such that its output is already in the range $[P_{MAX}/2, P_{MAX}/2)$, and subtraction circuit 1904 can be omitted.

Addition circuit 1908 can add perturbation P to the nominal brightness set point (or pulse width) $B_0$ and can deliver the result as a pulse width control input to pulse generator 1910, which can generate a pulse. The pulse can be delivered to a modulator circuit 1912, which can modulate an input (e.g., from Buck converter 1304 of FIG. 13) based on the pulse, thereby producing an output current. The pulse can also be used to increment counter 1902 (increment can trigger, e.g., on the falling edge of the pulse) so that the next pulse will have a different width.

It will be appreciated that system 1900 is illustrative and that variations and modifications are possible. Components not described in detail can be implemented using conventional or other circuit technology. In embodiments where there are multiple groups of LEDs, the same pulse generator 1910 can supply the same modulating pulse to a different modulator 1912 for each channels. In this manner, operating current for all channels can be subject to the same perturbations at the same time, and this can prevent color fluctuations.

Process 1600 can also be implemented in software. For example, as described above with reference to FIG. 12, some embodiments provide an interrupt service routine (e.g., process 1200) that can be invoked at regular intervals (e.g., once per pulse period) to generate or not generate a pulse on each channel. Process 1200 includes initializing per-channel drive counters (drvCnt) at the beginning of a brightness cycle based on the number of pulses that will be sent. In some embodiments, this process can include applying a perturbation to the drive counters.

Figure 20:
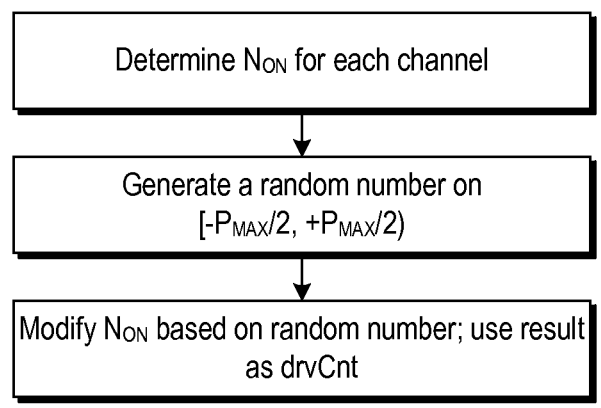
FIG. 20 is a flow diagram of a process for applying a perturbation to the drive counters of the process of FIG. 12 according to an embodiment of the present invention

FIG. 20 is a flow diagram of a process 2000 for applying a perturbation to the drive counters of process 1200 according to an embodiment of the present invention. Process 2000 can be implemented, e.g., at block 1208 of process 1200 described above.

At block 2002, process 2000 can determine a number of pulses ($N_{ON}$) to be sent on each channel, e.g., using techniques described above. This can correspond to a nominal width for a brightness pulse.

At block 2004, process 2000 can generate a random number uniformly distributed on the interval [$P_{MAX}/2$, $P_{MAX}/2$). Any type of random number generation algorithm can be used, including true-random and pseudorandom algorithms. In an alternative embodiment, a cyclical counter can be substituted for a random number generation algorithm. At block 2006, the number of pulses $N_{ON}$ can be modified based on the random number. For instance, the random number can be added to $N_{ON}$, or $N_{ON}$ can be dithered by one pulse based on where the random number falls within the allowed range.

In still other embodiments, the pulse width can be varied from its nominal value on a per-brightness-cycle basis. For example, referring to FIG. 10, the pulse width per channel established at block 1010 can be perturbed on a per-brightness-cycle basis. The amount of the total perturbation desired for the brightness cycle, which varies from 0 to 1 pulse, can be divided up among the pulses in the brightness cycle and applied as an adjustment to pulse width. The same adjustment can be applied to the pulse width for all channels to avoid color fluctuations.

Figure 21:
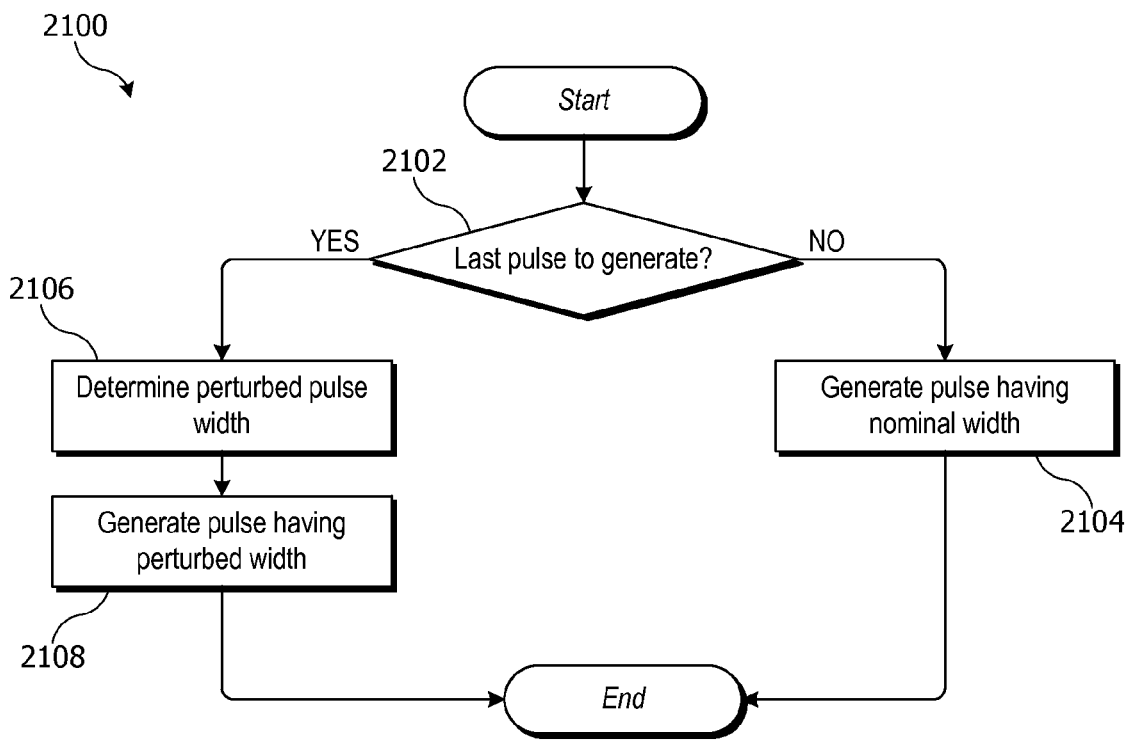
FIG. 21 is a flow diagram of a process for varying pulse width on a per-pulse basis according to an embodiment of the present invention.

Alternatively, referring to FIG. 12, pulse generation in the interrupt service routine can be modified to vary the width of the last pulse of a brightness cycle based on a perturbation that varies from one brightness cycle to the next. FIG. 21 is a flow diagram of a process 2100 for varying pulse width on a per-pulse basis according to an embodiment of the present invention. Process 2100 can be invoked, e.g., at pulse generation block 1224 of process 1200 described above. At block 2102, process 2100 can determine whether the pulse being generated is the last pulse for the current brightness cycle. For instance, in process 1200, if DitherBitSet is true, the last pulse occurs when drvCnt is 1, otherwise, it occurs when drvCnt is 2. If the pulse being generated is not the last, then at block 2104, process 2100 can generate a pulse of the nominal pulse width.

If the pulse being generated is the last, then at block 2106, process 2100 can determine a perturbed pulse width. For instance, as described above, process 2100 can generate a random number on an interval corresponding to the pulse period and can perturb the pulse width based on the random number. (Alternatively, a counter can be used.) The same random number can be applied to all channels for a given brightness cycle, with a new random number being generated for each brightness cycle. At block 2108, process 2100 can generate a pulse having the perturbed pulse width. The effect of using process 2100 to generate pulses in the interrupt service routine of FIG. 12 can be similar to the hardware modulation described above with reference to FIGS. 17A-D, which can effectively alter a pulse width.

It will be appreciated that process 2100 is illustrative and that variations and modifications are possible. Steps described as sequential may be executed in parallel, order of steps may be varied, and steps may be modified, combined, added or omitted. In some embodiments, rather than modifying the width of the last pulse, a process similar to process 2100 can be used to determine whether to generate an additional pulse in the pulse period after the nominal last pulse, with the width of the additional pulse being based on a perturbation amount that varies (e.g., randomly or cyclically) from one brightness cycle to the next.

While the invention has been described with respect to specific embodiments, one skilled in the art will recognize that numerous modifications are possible, and that components, features and options described with reference to different embodiments can be combined. All numerical values and dimensions are provided for purposes of illustration and can be modified as desired.

For example, embodiments described herein include control circuits with three channels to independently supply operating current to three groups of LEDs. It is to be understood that any number of channels (and groups of LEDs) can be implemented. For example, some embodiments can use four groups of LEDs. Further, while the embodiments described above may use a particular combination of LEDs (e.g., red, whitish, and yellowish), other color combinations can also be used, such as red, green, and blue (three channels); red, green, whitish, and yellowish (four channels); red green, blue, and yellowish (four channels); or other combinations. In some embodiments, fewer than three channels can be used.

The control circuits described above can be constructed using low-cost off-the-shelf components. For example, a low-cost, low-power microcontroller can implement the control algorithms described above. Thus, the cost of manufacturing and operating the light source module can be kept low. However, other implementations of control circuits and algorithms may be substituted.

In certain embodiments described above, pulse width perturbations can be applied using either a cyclical perturbation amount (e.g., based on a counter) or a random perturbation amount. Cyclical perturbations can be easier to implement, particularly in hardware. However, a cyclical perturbation has a periodicity and therefore can create a carrier frequency. A random perturbation generally does not create a carrier frequency, which may be useful in certain situations. The resulting spread spectrum may also reduce peak emissions and potential interference with other equipment, and this can be useful even in a single-channel application. Pulse-width perturbations as described herein can be applied in any context in which a first PWM output is further modulated by a second PWM.

Further, in examples described above, the perturbation is applied symmetrically around the nominal pulse width. In some embodiments, the perturbation can be applied asymmetrically (e.g., always increasing or always reducing the nominal pulse width), and the perturbation range need not be centered on the nominal pulse width.

In the examples described above, control signals for color temperature and/or brightness can be provided to the microcontroller via a connector as shown. In some embodiments, the connector can be connected to an external electromechanical control device, such as a knob or slider that can produce various signal levels between a minimum and maximum value. Separate control devices can be provided for CCT and brightness settings. In other embodiments, the connector can be connected to an external control device that provides a digital interface, which can include control buttons, knobs, sliders or the like operable to increase or decrease brightness and/or color temperature (e.g., in digitized increments); a display screen with a graphical user interface that allows the user to operate on-screen control elements to adjust settings; or the like. The external control device can generate control signals formatted according to a protocol recognized by the microcontroller, such as $I^2C$ or various serial protocols.

In some embodiments, the external control device can include an external interface module that connects to the connector of the light-source module and a physically distinct user-interface device that that communicates wirelessly with the external interface module, e.g., using RF protocols such as Bluetooth, Wi-Fi, infrared signaling, or the like. The user-interface device can be a special-purpose device, or it can be a programmable device such as a smart phone or tablet computer that executes an application program to communicate with the light source. The external interface module can translate signals received from the user-interface device into a protocol recognized by the MCU. In still other embodiments, a wireless signal transceiver (e.g., an RF transceiver) can be mounted on PCB 106 or elsewhere within the light-source module, and the user can operate a user-interface device that communicates directly with the onboard transceiver.

Further, control signals for color temperature and/or brightness can be generated automatically. For instance, a timer system can automatically change the color temperature and/or brightness based on time of day (e.g., cooler and brighter lights in the day, warmer and dimmer at night). As another example, sensor-based feedback system can automatically adjust color temperature and/or brightness settings based on detected ambient light. Automated control devices can be programmed to provide appropriate control signals over time, and real-time user interaction is not required. Those skilled in the art will recognize that control algorithms as described herein can be implemented without regard for the manner in which the control signals are generated.

Embodiments of the present invention can be realized using any combination of dedicated components and/or programmable processors (e.g., microcontrollers) and/or other programmable devices. The various processes described herein can be implemented on the same processor or different processors in any combination. Where components are described as being configured to perform certain operations, such configuration can be accomplished, e.g., by designing electronic circuits to perform the operation, by programming programmable electronic circuits (such as a microcontroller or other microprocessor) to perform the operation, or any combination thereof. Further, while the embodiments described above may make reference to specific hardware and software components, those skilled in the art will appreciate that different combinations of hardware and/or software components may also be used and that particular operations described as being implemented in hardware might also be implemented in software or vice versa.

Computer programs incorporating various features of the present invention may be encoded and stored on various computer readable storage media; suitable media include magnetic disk or tape, optical storage media such as compact disk (CD) or DVD (digital versatile disk), flash memory, and other non-transitory media. Computer readable media encoded with the program code may be packaged with a compatible electronic device (e.g., encoded in ROM within the light source module), or the program code may be provided separately from electronic devices (e.g., via Internet download or as a separately packaged computer-readable storage medium).

Thus, although the invention has been described with respect to specific embodiments, it will be appreciated that the invention is intended to cover all modifications and equivalents within the scope of the following claims.

What is claimed is:

1. A method comprising:
   generating a first pulse sequence using a first pulse-width modulator, the first pulse sequence having a first pulse period corresponding to a high frequency;
   generating a modulating pulse sequence using a second pulse-width modulator, the modulating pulse sequence having a second pulse period corresponding to a low frequency,
   wherein generating each modulating pulse in the modulating pulse sequence includes perturbing a width of the modulating pulse by a perturbation amount, the perturbation amount being in a range corresponding to the first pulse period, and wherein different modulating pulses in the sequence are perturbed by different amounts; and
   modulating the pulse train using the sequence of modulating pulses to produce an output electrical signal.

2. The method of claim 1 further comprising:
   using the output electrical signal to drive a serially-connected group of LEDs.

3. The method of claim 1 further comprising:
   generating a plurality of pulse trains using a plurality of first pulse-width modulators;
   modulating each of the plurality of pulse trains using the sequence of modulating pulses to produce a plurality of output signals; and
   using each of the plurality of output signals to drive a different one of a plurality of serially-connected groups of LEDs.

4. The method of claim 1 further comprising:
   determining the perturbation amount for each modulating pulse, wherein the determination is based on a cyclical perturbation.

5. The method of claim 1 further comprising:
   determining the perturbation amount for each modulating pulse, wherein the determination is based on a random number generator.

6. A method of controlling brightness and color temperature in a light source device having a plurality of independently addressable groups of LEDs, wherein the LEDs in each group emit light of a different color, the method comprising:
   determining a target color temperature and a brightness set-point based at least in part on a received control signal;
   computing, for each of a plurality of output channels, a nominal pulse width and a number of pulses to include in a pulse train, the pulse train having a duration defined as a fixed number of pulse periods, the computation being based at least in part on the target color temperature and the brightness set-point;
   computing a perturbation amount;
   computing, for each of the output channels, a perturbed pulse width from the nominal pulse width and the perturbation amount;
   generating, on each of the plurality of output channels, a pulse train, the pulse train including the number of pulses computed for that output channel, wherein at least one of the pulses in the pulse train has a width equal to the perturbed pulse width;
   converting each of the pulse trains to an operating current; and
   delivering each of the operating currents to a different one of the independently addressable groups of LEDs.

7. The method of claim 6 wherein only one of the pulses in the pulse train on each output channel has the perturbed pulse width for the output channel and all other pulses in the pulse train have the nominal pulse width for the output channel.

8. The method of claim 6 wherein the perturbation amount is computed using a random number generator.

9. The method of claim 6 wherein the perturbation amount is computed using a cyclical counter.

10. A light source module comprising:
an emitter having a plurality of LEDs, the plurality of LEDs being electrically connected into two or more independently addressable groups of LEDs, wherein the LEDs in each group emit light of a different color; and
a current source module for each group,
wherein each current source module provides a current based on a color pulse sequence modulated by a brightness pulse sequence, the color pulse sequence having a first pulse period corresponding to a high frequency and a first pulse width selected based on a target light color, the brightness pulse sequence having a second pulse period corresponding to a low frequency and a nominal pulse width selected based on a target light brightness,
wherein a pulse width of each pulse in the brightness pulse sequence is perturbed from the nominal pulse width by a perturbation amount, the perturbation amount being in a range corresponding to the first pulse period, and wherein different brightness pulses in the brightness pulse sequence are perturbed by different amounts.

11. The light source module of claim 10 wherein all of LEDs are disposed on a single emitter substrate.

12. The light source module of claim 10 wherein the current source module includes:
a first pulse width modulator circuit to generate the color pulse sequence;
a current generator to generate a current using the output of the first pulse width modulator; and
a second pulse width modulator circuit to generate the brightness pulse sequence and to modulate the current from the current generator using the brightness pulse sequence.

13. The light source module of claim 10 further comprising:
a microcontroller configured to receive input settings specifying a color temperature and a brightness setting for the light source module and to generate a pulse train of a fixed duration on each of a plurality of output channels, the pulse train on each output channel including a selectable number of pulses having a selectable pulse width, wherein the microcontroller is further configured to select the number of pulses and the pulse width for each output channel based on the input settings and to perturb the selected pulse width of at least some of the pulses on each output channel,
wherein the current source module includes:
a plurality of current regulators, each current regulator being coupled to provide an operating current to a different one of the independently addressable groups of LEDs in response to an adjustable input voltage and a constant reference voltage; and
a plurality of RC integrator circuits, each RC integrator circuit being coupled between a different one of the output channels of the microcontroller and a different one of the plurality of current regulators, each RC integrator circuit being configured to receive the pulse train from a different one of the output channels of the microcontroller and to provide the adjustable input voltage to a different one of the current regulators.

14. The light source module of claim 13 wherein each pulse train on each output channel has a duration defined as a fixed number of pulse periods and the duration of the pulse train is the same on all of the output channels.

15. The light source module of claim 14 wherein the microcontroller is further configured such that if the selected number of pulses for a particular pulse train is less than the number of pulse periods in the pulse train, a pulse is generated for each pulse period up to the selected number and no pulse is generated for subsequent pulse periods for the duration of the pulse train.

16. The light source module of claim 13 wherein:
the adjustable input voltage provided by each of the RC integrator circuits fluctuates with time; and
the operating current produced by each of the current regulators fluctuates with time at a frequency high enough that a resulting flickering of the LEDs is undetectable to a human eye.

17. The light-source module of claim 10 wherein the independently addressable groups of LEDs include:
a first group comprising one or more red LEDs; and
a second group comprising one or more blue LEDs having a quantity of yellow phosphor disposed thereon to produce whitish light.

18. The light-source module of claim 10 wherein the independently addressable groups of LEDs include:
a first group comprising one or more red LEDs;
a second group comprising one or more blue LEDs having a first quantity of yellow phosphor disposed thereon to produce whitish light; and
a third group comprising one or more blue LEDs having a second quantity of yellow phosphor disposed thereon to produce yellowish light.

19. The light source module of claim 18 wherein: the yellowish light corresponds to a first region in a CIE color space, the first region having a CIE-x coordinate between 0.42 and 0.45 and a CIE-y coordinate between 0.50 and 0.54; the whitish light corresponds to a second region in the CIE color space, the second region having a CIE-x coordinate between 0.31 and 0.34 and a CIE-y coordinate between 0.34 and 0.37; and the red light corresponds to a third region in the CIE color space, the third region having a CIE-x coordinate between 0.68 and 0.70 and a CIE-y coordinate between 0.30 and 0.32.

20. The light source module of claim 18 wherein the second group of LEDs and the third group of LEDs are substantially free of red phosphor.

21. The light source module of claim 18 wherein the yellow phosphor comprises yttrium aluminum garnet (YAG).

22. The light source module of claim 10 wherein the LEDs in each group are electrically connected in series with each other.

23. The light source module of claim 13 wherein the microcontroller is further configured to dither the selected number of pulses for a given output channel between two consecutive integers for different pulse trains.

24. The light source module of claim 10 wherein the microcontroller is further configured to select a pulse width for each of the output channels based on the specified color temperature and to select the number of pulses for the output channels based on the specified brightness setting.

* * * * *